US006418228B1

(12) United States Patent
Terai et al.

(10) Patent No.: US 6,418,228 B1
(45) Date of Patent: Jul. 9, 2002

(54) NOISE CONTROL SYSTEM

(75) Inventors: Kenichi Terai, Shijonawate; Hiroyuki Hashimoto, Daitou; Isao Kakuhari, Mino, all of (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 09/353,667

(22) Filed: Jul. 15, 1999

(30) Foreign Application Priority Data

Jul. 16, 1998 (JP) .......................................... 10-202363
Jun. 4, 1999 (JP) .......................................... 11-158775
Jun. 4, 1999 (JP) .......................................... 11-158776

(51) Int. Cl.[7] ................................................ H03B 29/00
(52) U.S. Cl. .................................... 381/71.8; 381/71.11
(58) Field of Search .............................. 381/71.1, 71.8, 381/71.12, 71.14, 94.1, 94.9, 71.5

(56) References Cited

U.S. PATENT DOCUMENTS 5,278,780 A * 1/1994 Eguchi ....................... 708/322
5,337,366 A * 8/1994 Eguchi et al. ........... 381/71.11
5,377,276 A * 12/1994 Terai et al. .............. 381/71.11
5,388,160 A * 2/1995 Hashimoto et al. ....... 381/71.14
5,586,189 A 12/1996 Allie et al.
5,586,190 A 12/1996 Trantow et al.
5,710,822 A 1/1998 Steenhagen et al.

FOREIGN PATENT DOCUMENTS

JP 5-67948 3/1993
JP 7-271383 * 10/1995 ......... G10K/11/178

OTHER PUBLICATIONS

B. Widrow et al., "Adaptive Signal Processing", Prentice-Hall Signal Processing Series, pp. 288–293, 1985.

* cited by examiner

*Primary Examiner*—Xu Mei
*Assistant Examiner*—Brian Tyrone Pendleton
(74) *Attorney, Agent, or Firm*—Ratner & Prestia

(57) ABSTRACT

A noise control system includes: a control sound generator for generating a control sound; an error detector for detecting an error signal between the control sound and noise; a noise detector for detecting a noise source signal; an adaptive filter for outputting a control signal; and a coefficient updator for updating a coefficient of the adaptive filter. The coefficient updator includes at least a first digital filter, a first coefficient update calculator, a second digital filter, a phase inverter, a third digital filter, and a second coefficient update calculator. Alternatively, the coefficient updator includes at least a first digital filter, a second digital filter, a third digital filter, a coefficient update calculator, a phase inverter, a first adder, and a second adder. In either case, the coefficient updator has a function of suppressing an increase in a coefficient gain of the adaptive filter in a predetermined frequency band.

20 Claims, 23 Drawing Sheets

NOISE CONTROL SYSTEM

BACKGROUND OF THE INVENTION

1. Field of the Invention

The present invention relates to a noise control system based on active noise control, for use in a noisy environment.

2. Description of the Related art

In recent years, an active noise control system has been proposed which eliminates environmental noise, using a control sound from a loud speaker, etc. This type of a noise control system in the conventional art employs an adaptive filter for calculating a noise control signal, and may further employ an auxiliary adaptive filter for preventing an increase in the gain of the adaptive filter, as disclosed in, for example, Japanese Laid-Open Publication No. 5-67948.

FIG. 22 is a block diagram illustrating a structure of such a conventional noise control system. Referring to FIG. 22, the noise control system includes a control speaker 1, an error detection microphone 2 which functions as an error detector, a noise detection microphone 3 which functions as a noise detector, adaptive filters 4 and 15, a digital filter 5 which approximates the propagation characteristic between the control speaker 1 and the error detection microphone 2, coefficient update calculators 6 and 9, and a digital filter 7 having a frequency band limiting characteristic.

With the structure illustrated in FIG. 22, noise generated from a noise source is detected by the noise detector 3, and a noise source signal is generated based on the detection result. The generated noise source signal is processed by the adaptive filter 4, so as tp output a control signal. A control sound is generated from the control speaker 1 based on the control signal so that the control sound interferes with the noise from the noise source, thereby reducing the noise.

Moreover, the state of interference between the control sound output from the control speaker 1 and the noise is measured by the error detector (microphone) 2. The output of the error detector (microphone) 2 should ideally be zero as a result of the noise control. Therefore, the coefficient update calculator 6 performs a calculation such that the output signal of the error detector (microphone) 2 is reduced, and controls the coefficient of the adaptive filter 4 based on the calculation result.

On the other hand, the coefficient update calculator 9 performs a calculation such that the output of the adaptive filter 15 is reduced, and controls the coefficient of the adaptive filter 15 based on the calculation result. A band limiting signal produced by the digital filter 7 is input to the adaptive filter 15, and the coefficient of the adaptive filter 15 converges into a value which suppresses signals in the band. The coefficients of the adaptive filters 4 and 15 can be shared by each other so as to combine the effects of the two coefficient update calculators 6 and 9 together, and the update operation of the coefficient of the adaptive filter 4 is suppressed in a band which is set in the digital filter 7.

FIG. 23 is a block diagram illustrating a structure of another conventional noise control system as disclosed in Japanese Laid-Open Publication No. 7-271383. Referring to FIG. 23, the noise control system includes a control speaker 1, an error detection microphone 2 which functions as an error detector, a noise detection microphone 3 which functions as a noise detector, an adaptive filter 4, a digital filter 5 which approximates the propagation characteristic between the control speaker 1 and the error detection microphone 2, coefficient update calculators 6 and 9, digital filters 7 and 8 each having a frequency band limiting characteristic, and a switch section 32.

With the structure illustrate din FIG. 23, noise generated from a noise source is detected by the noise detector 3, and a noise source signal is generated based on the detection result. The generated noise source signal is processed by the adaptive filter 4, so as to output a control signal. A control sound is generated from the control speaker 1 base don the control signal so that the control source interferes with the noise from the noise source, thereby reducing the noise.

Moreover, the state of interference between the control sound output from the control speaker 1 and the noise is measured by the error detector (microphone) 2. The output of the error detector (microphone) 2 should ideally be zero as a result of the noise control. Therefore, the coefficient update calculator 6 performs a calculation such that the output signal of the error detector (microphone) 2 is reduced. A band limiting signal produced by the digital filter 7 and another band limiting signal produced by the digital filter 8 are input to the coefficient update calculator 9, and the coefficient update calculator 9 performs a coefficient update calculation such that the adaptive filter 4 suppresses the output of the signal in the band. The switch section 32 switches between the outputs of the coefficient update calculators 6 and 9, so as to control the update operation of the band limitation by the digital filters 7 and 8.

However, the conventional noise control system as illustrated in FIG. 22 requires the auxiliary adaptive filter 15 for controlling the update operation of the coefficient of the adaptive filter 4, thereby increasing the amount of calculation to be performed.

The other conventional noise control system as illustrated in FIG. 23 requires tow coefficient update calculators 6 and 9, thereby increasing the amount of calculation to be performed. Moreover, since the witching between the outputs of the coefficient update calculators 6 and 9 is done by the switch section 32, coefficient update operations of the adaptive filter by the coefficient update calculators 6 and 9 cannot be arbitrarily weighed.

SUMMARY OF THE INVENTION

A noise control system of the present invention includes: a control sound generator for generating a control sound; an error detector for detecting an error signal between the control sound and noise; a noise detector for detecting a noise source signal; an adaptive filter for outputting a control signal; and a coefficient updator for updating a coefficient of the adaptive filter, the coefficient updator comprising at least a first digital filter, a first coefficient update calculator, a second digital filter, a phase inverter, a third digital filter, and a second coefficient update calculator. The coefficient updator has a function of suppressing an increase in a coefficient gain of the adaptive filter in a predetermined frequency band.

In one embodiment, the coefficient updator is such that: the first digital filter receives, as an input thereto, an output of the noise detector; the first coefficient update calculator receives, as inputs thereto, an output of the first digital filter and an output of the error detector; the phase inverter inverts the output of the noise detector; the second digital filter receives, as an input thereto, an output of the phase inverter; the third digital filter receives, as an input thereto, the output of the error detector; the second coefficient update calculator receives, as inputs thereto, outputs of the second and third digital filters; the first digital filter approximates a propagation characteristic between the control sound generator and the error detector; the second and third digital filters have a common passband frequency characteristic; the first coefficient update calculator performs a calculation such that the output of the error detector is reduced, and updates the coefficient of the adaptive filter based on the calculation result; and the second coefficient update calculator performs a calculation such that the output of the third digital filter is reduced, and updates the coefficient of the adaptive filter based on the output of the coefficient update calculator.

In another embodiment, the coefficient updator is such that: the first digital filter receives, as an input thereto, an output of the noise detector; the first coefficient update calculator receives, as inputs thereto, an output of the first digital filter and an output of the error detector; the second digital filter receives, as an input thereto, an output of the noise detector; the third digital filter receives, as an input thereto, the output of the error detector; the second coefficient update calculator receives, as inputs thereto, outputs of the second and third digital filters; the phase inverter inverts an output of the second coefficient update calculator; the first digital filter approximates a propagation characteristic between the control sound generator and the error detector; the second and third digital filters have a common passband frequency characteristic; the first coefficient update calculator performs a calculation such that the output of the error detector is reduced, and updates the coefficient of the adaptive filter based on the calculation result; and the second coefficient update calculator performs a calculation such that the output of the third digital filter is reduced, inverts and outputs the calculation result, and updates the coefficient of the adaptive filter based on the output of the second coefficient update calculator.

In still another embodiment, the coefficient updator further includes: a first selection controller for thinning out the outputs of the first coefficient update calculator; a second selection controller for thinning out the outputs of the second coefficient update calculator; and a selection control calculator for receiving an output signal of the third digital filter to control the first and second selection controllers; the first digital filter receives, as an input thereto, an output of the noise detector; the first coefficient update calculator receives, as inputs thereto, an output of the first digital filter and an output of the error detector; the phase inverter inverters an output of the adaptive filter; the third digital filter receives, as an input thereto, an output of the phase inverter; the second coefficient update calculator receives, as inputs thereto, outputs of the second and third digital filters; the first digital filter approximates a propagation characteristic between the control sound generator and the error detector; the second and third digital filters have a common passband frequency characteristic; the first coefficient update calculator performs a calculation such that the output of the error detector is reduced; the second coefficient update calculator performs a calculation such that the output of the third digital filter is reduced; and when a level of the output signal of the third digital filter exceeds a predetermined value, the selection control calculator updates the coefficient of the adaptive filter by controlling the first and second selection controllers so that the first selection controller performs the thinning-out operation at a thinning-out frequency lower than that of the second selection controller.

In still another embodiment, the coefficient updator further includes: a first selection controller for switching between selecting an output of the first coefficient update calculator and selecting nothing; a second selection controller for switching between selecting an output of the second coefficient update calculator and selecting nothing; and a selection control calculator for receiving an output signal of the third digital filter to control the first and second selection controllers; the first digital filter receives, as an input thereto, an output of the noise detector; the first coefficient update calculator receives, as inputs thereto, an output of the first digital filter and an output of the error detector; the phase inverter inverts an output of the adaptive filter; the third digital filter receives, as an input thereto, an output of the phase inverter; the second coefficient update calculator receives, as inputs thereto, outputs of the second ad third digital filters; the first digital filter approximates a propagation characteristic between the control sound generator and the error detector; the second and third digital filters have a common passband frequency characteristic; the first coefficient update calculator performs a calculation such that the output of the error detector is reduced; the second coefficient update calculator performs a calculation such that the output of the third digital filter is reduced; and when a level of the output signal of the third digital filter exceeds a predetermined value, the selection control calculator updates the coefficient of the adaptive filter by controlling the first and second selection controllers so that the first selection controller is switched to select nothing at a switching operation frequency lower than that at which the second selection controller is switched to select nothing.

In still another embodiment, the coefficient updator further includes: a signal level converter for receiving an output signal of the third digital filter to convert a level of the signal; and a multiplier for multiplying an output of the signal level converter by an output of the second coefficient update calculator so as to update the coefficient of the adaptive filter; the first digital filter receives, as an input thereto, an output of the noise detector; the first coefficient update calculator receives, as inputs thereto, an output of the first digital filter and an output of the error detector; the second digital filter receives, as an input thereto, the output of the noise detector; the phase inverter inverts an output of the adaptive filter; the third digital filter receives, as an input thereto, an output of the phase inverter; the second coefficient update calculator receives, as inputs thereto, outputs of the second and third digital filters; the first digital filter approximates a propagation characteristic between the control sound generator and the error detector; the second and third digital filters have a common passband frequency characteristic; the first coefficient update calculator performs a calculation such that the output of the error detector is reduced; the second coefficient update calculator performs a calculation such that the output of the third digital filter is reduced; and the signal level converter has an input-output characteristic which is approximated to a characteristic obtained by normalizing an input-distortion characteristic of the control sound generator.

In each of the above-described configurations, the predetermined frequency band may exist in a low frequency region.

For example, the predetermined frequency band may be a frequency region where the frequency is less than or equal to a lower limit reproducible frequency of the control sound generator.

Another noise control system of the present invention includes: a control sound generator for generating a control sound; an error detector for detecting an error signal between the control sound and noise; a noise detector for detecting a noise source signal; an adaptive filter for outputting a control signal; and a coefficient updator for updating a coefficient of the adaptive filter, the coefficient updator comprising at least a first digital filter, a second digital filter, a third digital filter, a coefficient update calculator, a phase inverter, a first adder, and a second adder. The coefficient updator has a function of suppressing an increase in a coefficient gain of the adaptive filter in a predetermined frequency band.

In one embodiment, the coefficient updator is such that: the first digital filter receives, as an input thereto, an output of the noise detector; the second digital filter receives, as an input thereto, the output of the noise detector; the first adder receives, as inputs thereto, an output of the first digital filter and an output of the second digital filter; the second adder receives, as inputs thereto, an output of the error detector and an output of the third digital filter; the coefficient update calculator receives, as inputs thereto, an output of the first adder and an output of the second adder; the phase inverter inverts an output of the adaptive filter; the third digital filter receives, as an input thereto, the output of the phase inverter; the first digital filter approximates a propagation characteristic between the control sound generator and the error detector; the second and third digital filters have a common passband frequency characteristic; and the coefficient update calculator performs a calculation such that the output of the second adder is reduced, and updates the coefficient of the adaptive filter based on the calculation result.

In another embodiment, the coefficient updator is such that: the first digital filter receives, as an input thereto, an output of the noise detector; the phase inverter inverts the output of the noise detector; the second digital filter receives, as an input thereto, the output of the phase inverter; the first adder receives, as inputs thereto, an output of the first digital filter and an output of the second digital filter; the second adder receives, as inputs thereto, an output of the error detector and an output of the third digital filter; the coefficient update calculator receives, as inputs thereto, an output of the first adder and an output of the second adder; the third digital filter receives, as an input thereto, an output of the adaptive filter; the first digital filter approximates a propagation characteristic between the control sound generator and the error detector; the second and third digital filters have a common passband frequency characteristic; and the coefficient update calculator performs a calculation such that the output of the second adder is reduced, and updates the coefficient of the adaptive filter based on the calculation result.

In still another embodiment, the coefficient updator further includes: a first coefficient controller for multiplying an output of the second digital filter by a first coefficient factor; and a second coefficient controller for multiplying an output of the third digital filter by a second coefficient factor; the first digital filter receives, as an input thereto, an output of the noise detector; the second digital filter receives, as an input thereto, the output of the noise detector; the first adder receives, as inputs thereto, an output of the first digital filter and an output of the first coefficient controller; the second adder receives, as inputs thereto, an output of the error detector and an output of the second coefficient controller; the coefficient update calculator receives, as inputs thereto, an output of the first adder and an output of the second adder; the phase inverter inverts an output of the adaptive filter; the third digital filter receives, as an input thereto, the output of the phase inverter; each of the first coefficient factor and the second coefficient factor is set to be equal to or more than 1; the first digital filter approximates a propagation characteristic between the control sound generator and the error detector; the second and third digital filters have a common passband frequency characteristic; and the coefficient update calculator performs a calculation such that the output of the second adder is reduced, and updates the coefficient of the adaptive filter based on the calculation result.

For example, the first coefficient controller may be set so that in a passband of the second digital filter, the output of the first coefficient controller is larger than an output signal of the first digital filter. Alternatively, the second coefficient controller may be set so that in a passband of the third digital filter, the output of the second coefficient controller is larger than an output signal of the error detector.

In one embodiment, the coefficient updator further includes: a first coefficient controller for multiplying an output of the first digital filter by a first coefficient factor; and a second coefficient controller for multiplying an output of the error detector by a second coefficient factor; the first digital filter receives, as an input thereto, an output of the noise detector; the second digital filter receives, as an input thereto, the output of the noise detector; the first adder receives, as inputs thereto, an output of the first coefficient controller and an output of the second digital filter; the second adder receives, as inputs thereto, an output of the second coefficient controller and an output of the third digital filter; the coefficient update calculator receives, as inputs thereto, an output of the first adder and an output of the second adder; the phase inverter inverts an output of the adaptive filter; the third digital filter receives, as an input thereto, the output of the phase inverter; each of the first coefficient factor and the second coefficient factor is set to be less than or equal to 1; the first digital filter approximates a propagation characteristic be between the control sound generator and the error detector; the second and third digital filters have a common passband frequency characteristic; and the coefficient update calculator performs a calculation such that the output of the second adder is reduced, and updates the coefficient of the adaptive filter based on the calculation result.

For example, the first coefficient controller may be set so that in a passband of the second digital filter, the output of the first coefficient controller is smaller than an output signal of the first digital filter. Alternatively, the second coefficient controller may be set so that in a passband of the third digital filter, the output of the second coefficient controller is smaller than an output signal of the error detector.

In each of the above-described configurations, the predetermined frequency band may exist in a low frequency region.

For example, the predetermined frequency band may be a frequency region where the frequency is less than or equal to a lower limit reproducible frequency of the control sound generator.

The predetermined frequency band may exist in a frequency region where there is a correlation between an output signal of the noise detector and an output signal of the error detector.

With the noise control system of the present invention having the features as described above, the noise detection signal and the adaptive filter output signal are processed by the band limiting digital filters, which have the same characteristic, so as to produce a coefficient update signal in the negative direction from both of the output signals, thereby controlling the adaptive filter used in a noise control calculation. In this way, the present invention prevents an undesired increase in the coefficient gain of the adaptive filter in the band of the above-described digital filter, while realizing a coefficient control of the adaptive filter used in a noise control calculation without having to use additional hardware such as an adaptive filter or an additional calculation process, thereby realizing a stable noise processing operation.

Moreover, the update frequency, at which the negative coefficient update for the adaptive filter is performed, is controlled in view of the non-linear characteristic of the noise propagation system or the control sound generator, whereby it is possible to realize a noise control with no band limitation when the noise signal is small.

Thus, the invention described herein makes possible the advantage of providing a noise control system capable of a stable noise processing operation by controlling the coefficient of an adaptive filter used in noise control calculations without having to provide additional hardware such as an adaptive filter or an additional calculation process.

This and other advantages of the present invention will become apparent to those skilled in the art upon reading and understanding the following detailed description with reference to the accompanying figures.

DESCRIPTION OF THE PREFERRED EMBODIMENTS

Embodiment 1

A noise control system according to Embodiment 1 of the present invention will be described below with reference to the accompanying figures.

In the present embodiment, a low frequency band of the control signal is limited so that the adaptive filter does not generate an excessive control signal for noise having a frequency which is too low for the low band reproducibility of the control speaker.

Figure 1:
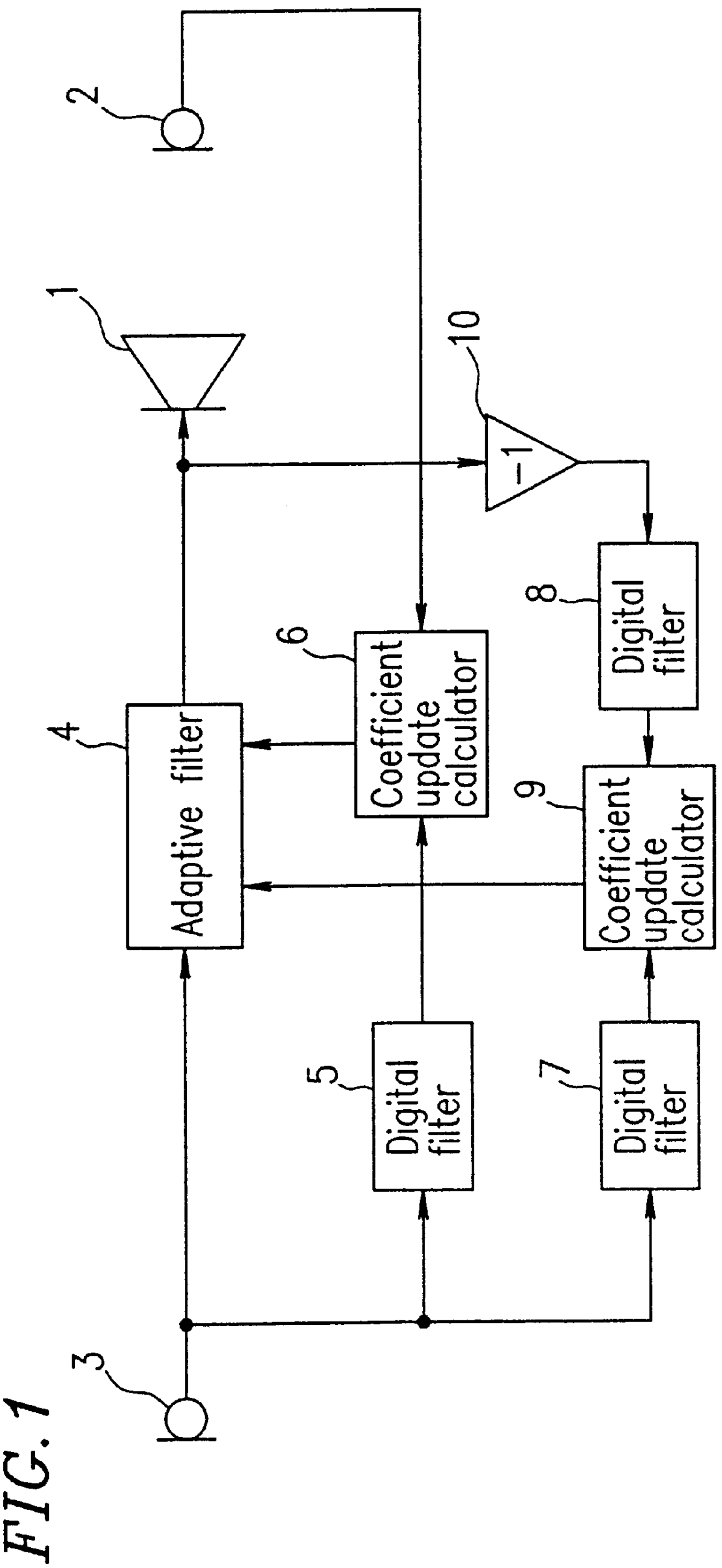
FIG. 1 is a block diagram illustrating a structure of a noise control system according to Embodiment 1 of the present invention.

FIG. 1 is a block diagram illustrating a structure of the noise control system of this embodiment. Referring to FIG. 1, the noise control system includes a control speaker 1, an error detection microphone 2 which functions as an error detector, a noise detection microphone 3 which functions as a noise detector, an adaptive filter 4, a digital filter 5 which approximates the propagation characteristic between the control speaker 1 and the error detection microphone 2, coefficient update calculators 6 and 9, digital filters 7 and 8 each having a frequency band limiting characteristic (band limiting filters), and a phase inverter 10 for inverting the output of the adaptive filter 4.

With the structure illustrated in FIG. 1, noise generated from a noise source is detected by a noise detector 3, and a noise source signal is generated based on the detection result. The generated noise source signal is processed by the adaptive filter 4, so as to output a control signal. A control sound is generated from the control speaker 1 based on the control signal so that the control sound interferes with the noise from the noise source, thereby reducing the noise.

Moreover, the state of interference between the control sound output from the control speaker 1 and the noise is measured by the error detector (microphone) 2. The output of the error detector (microphone) 2 should ideally be zero as a result of the noise control. Therefore, the coefficient update calculator 6 performs a coefficient update calculation as shown in Expression (1) later based on a filtered X-LMS method (see Widrow and Stearns, "Adaptive Signal Processing", 1985), or the like, so as to adjust the characteristic of the adaptive filter 4, such that the output signal of the error detector (microphone) 2 is reduced. This changes the control sound actually generated from the control speaker 1, thereby further reducing the noise.

Figure 2:
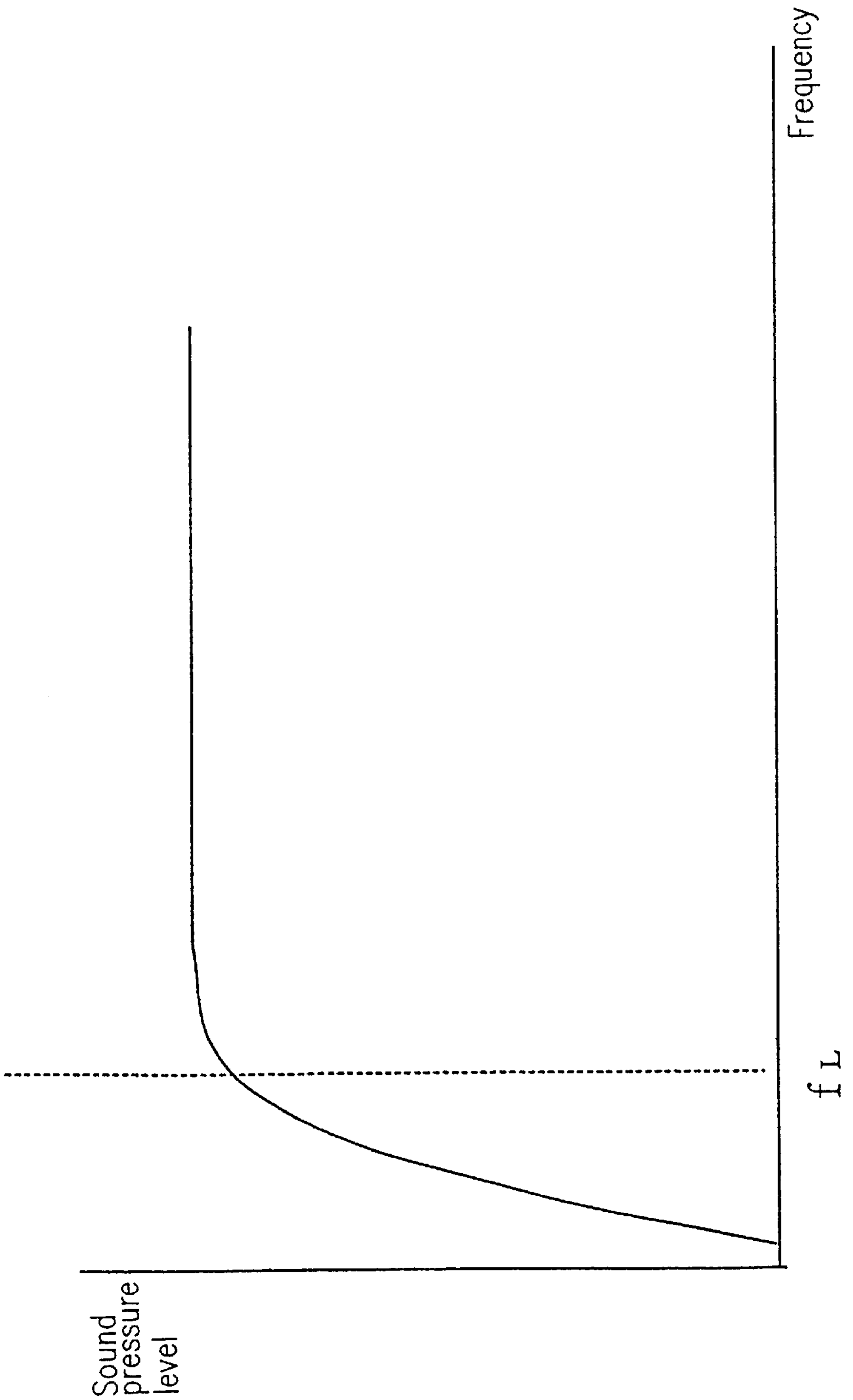
FIG. 2 illustrates a sound pressure-frequency characteristic of a control speaker which may be included in the structure of the present invention.
Figure 3:
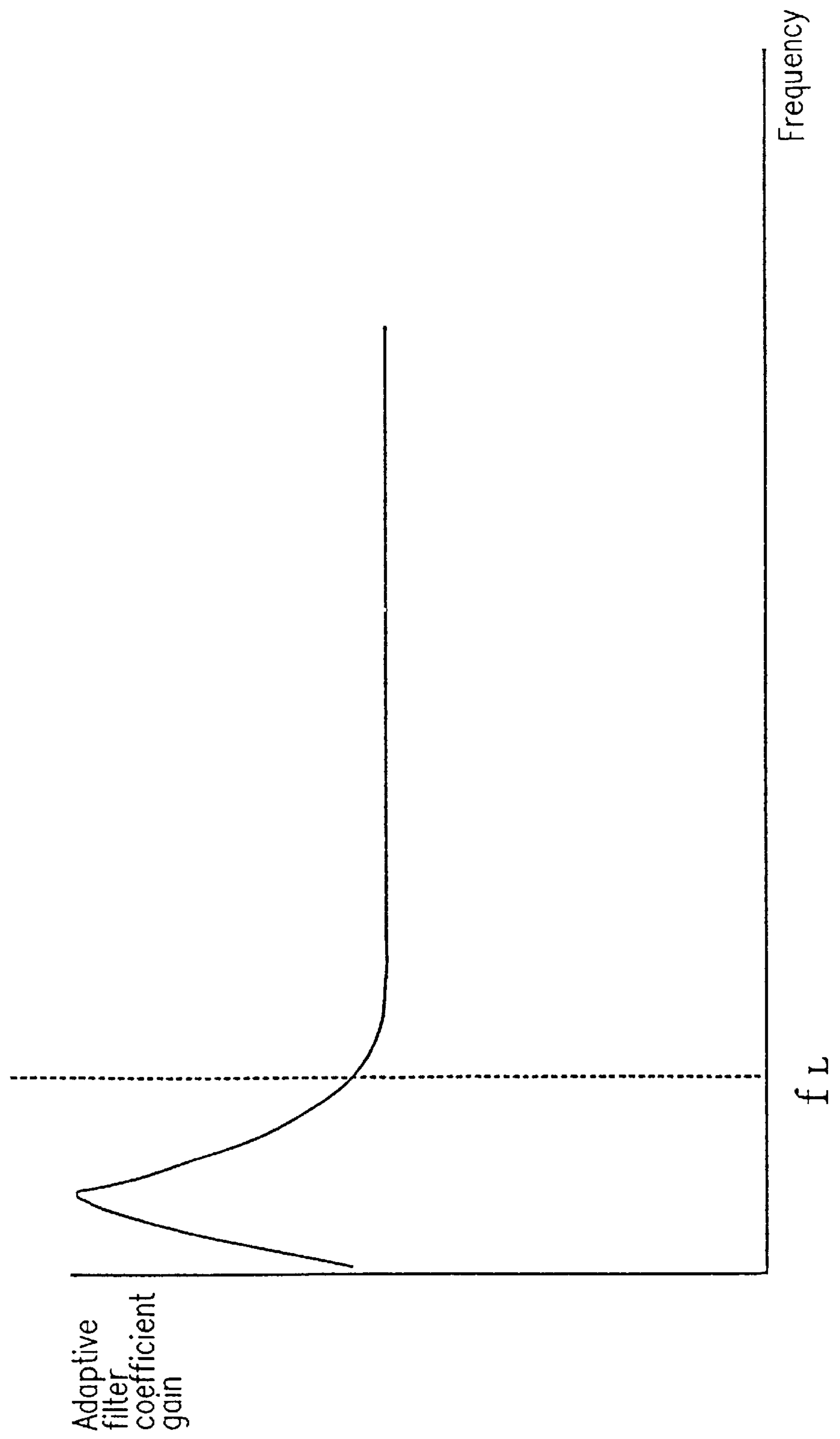
FIG. 3 illustrates a gain-frequency characteristic of an adaptive filter which is obtained by using only the coefficient update calculator 6 which is included in the structure of the present invention.

Typically, the frequency characteristic of the control speaker 1 is such that the sound pressure of an output thereof is reduced in a frequency region where the frequency is less than or equal to the lower limit reproducible frequency $f_L$, as shown in FIG. 2. For example, in the case where noise has a spectrum which includes such a low frequency region, if only the coefficient update calculator 6 is used for updating the coefficient of the adaptive filter 4, the coefficient gain of the adaptive filter 4 is required to sufficiently reduce (or cancel) the noise in the low frequency region while compensating for the characteristic of the control speaker 1, thereby converging into the characteristic as illustrated in FIG. 3, where the gain has an increase in the low frequency region (a region where the frequency is less than or equal to the lower limit reproducible frequency $f_L$ of the control speaker 1). In such a case, a large low frequency signal is input to the control speaker 1.

Figure 4:
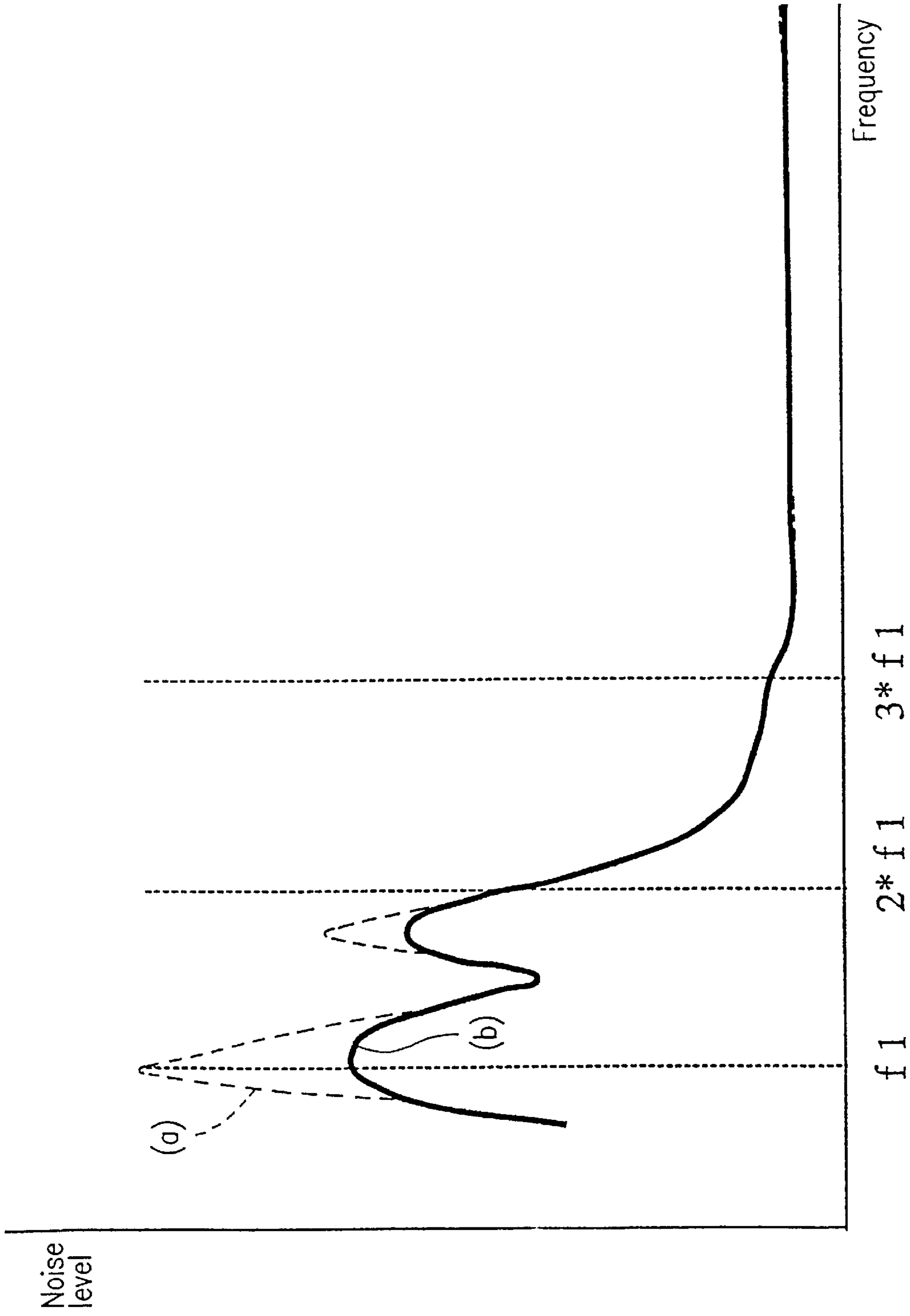
FIG. 4 illustrates a noise control characteristic while the control speaker is in a linear region.

In a region where the linearity of the control speaker is maintained, even if the noise spectrum at the error detector (microphone) 2 includes signals in the vicinity of a low frequency f1 as illustrated by a broken line (a) in FIG. 4, the peak of the noise level is cut down, as illustrated by a solid line (b) in FIG. 4, thereby realizing an appropriate sound eliminating operation.

Figure 5:
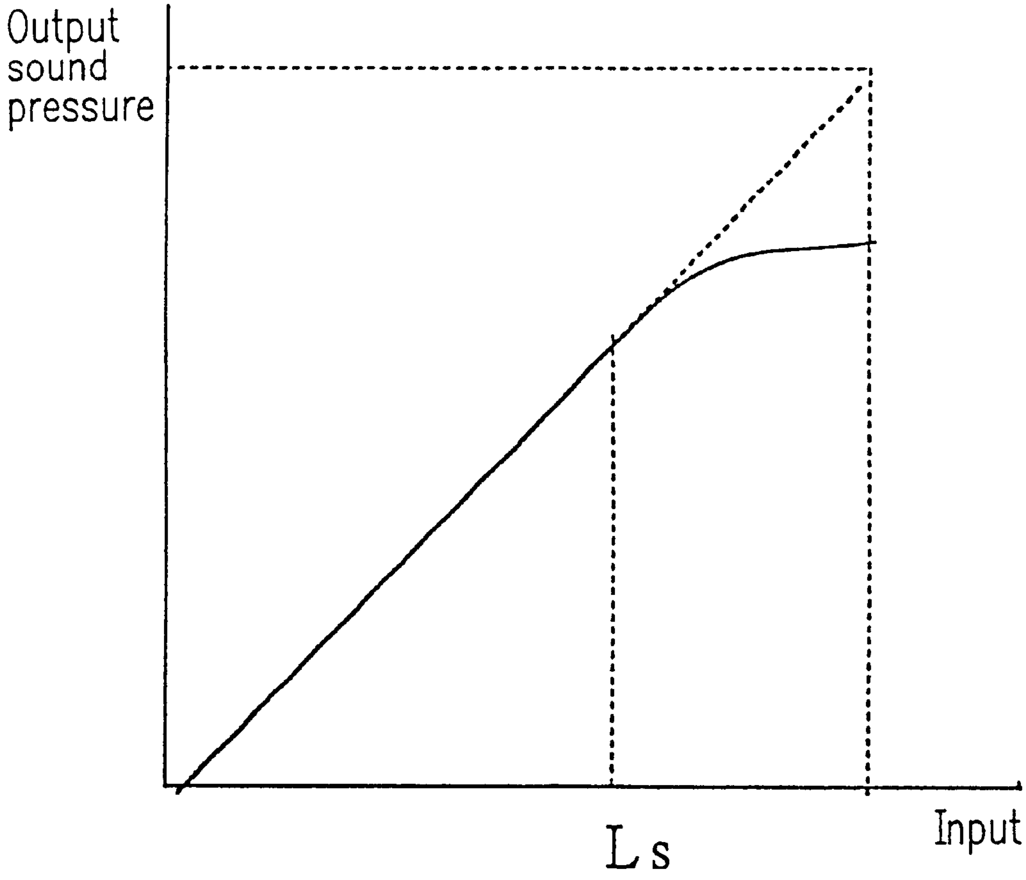
FIG. 5 illustrates an input-output characteristic of the control speaker which maybe included in the structure of the present invention.
Figure 6:
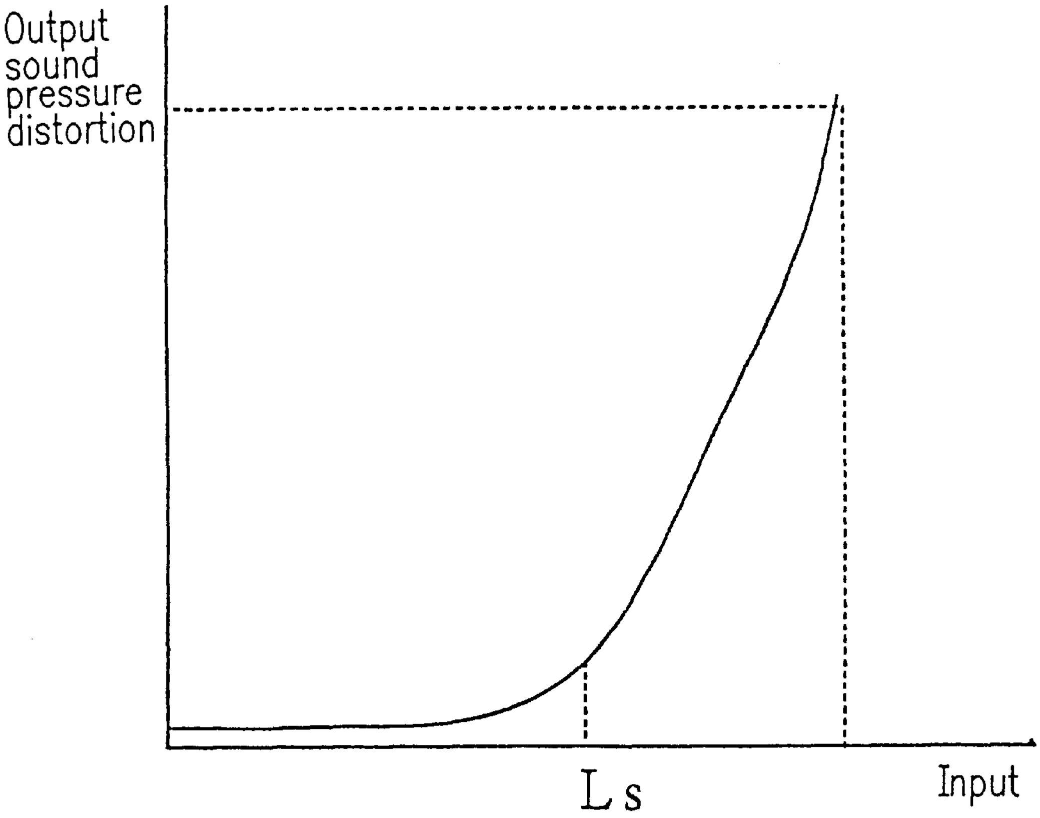
FIG. 6 illustrates an input-sound pressure distortion characteristic of the control speaker which may be included in the structure of the present invention.
Figure 7:
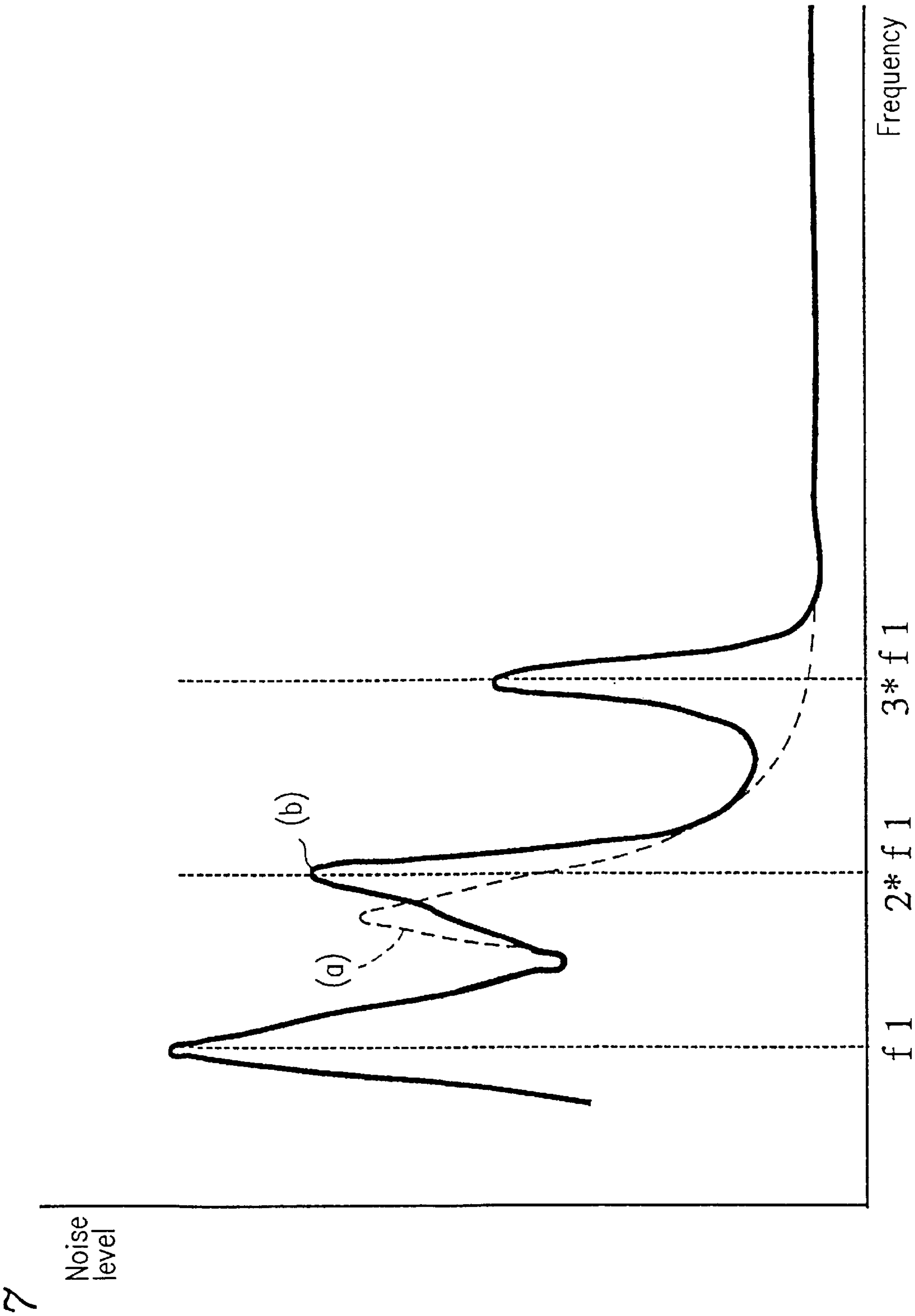
FIG. 7 illustrates a noise control characteristic while the control speaker is in a non-linear region.

However, where the control speaker 1 has a non-linear characteristic in the vicinity of such a low frequency, if the input level exceeds a threshold level Ls, the output sound pressure is saturated (see FIG. 5) while the distortion increases considerably (see FIG. 6), as illustrated in the input-output sound pressure characteristic of FIG. 5 and the input-output sound pressure distortion characteristic of FIG. 6. In such a case, if noise (corresponding to the broken line (a) in FIG. 4) whose spectrum at the error detector (microphone) 2 includes signals in the vicinity of the low frequency f1, as illustrated by the broken line (a) in FIG. 7, is processed with the conventional adaptive filter 4, a sufficient sound elimination cannot be realized because the control sound is saturated at the frequency f1. It may rather lead to generation of a higher harmonic wave distortion at a frequency twice or three times the frequency f1, as illustrated by a solid line (b) in FIG. 7, thereby creating new noise. The distortion may act as an error signal, thereby causing an adverse effect such as making the operation of the adaptive filter 4 unstable.

Figure 8:
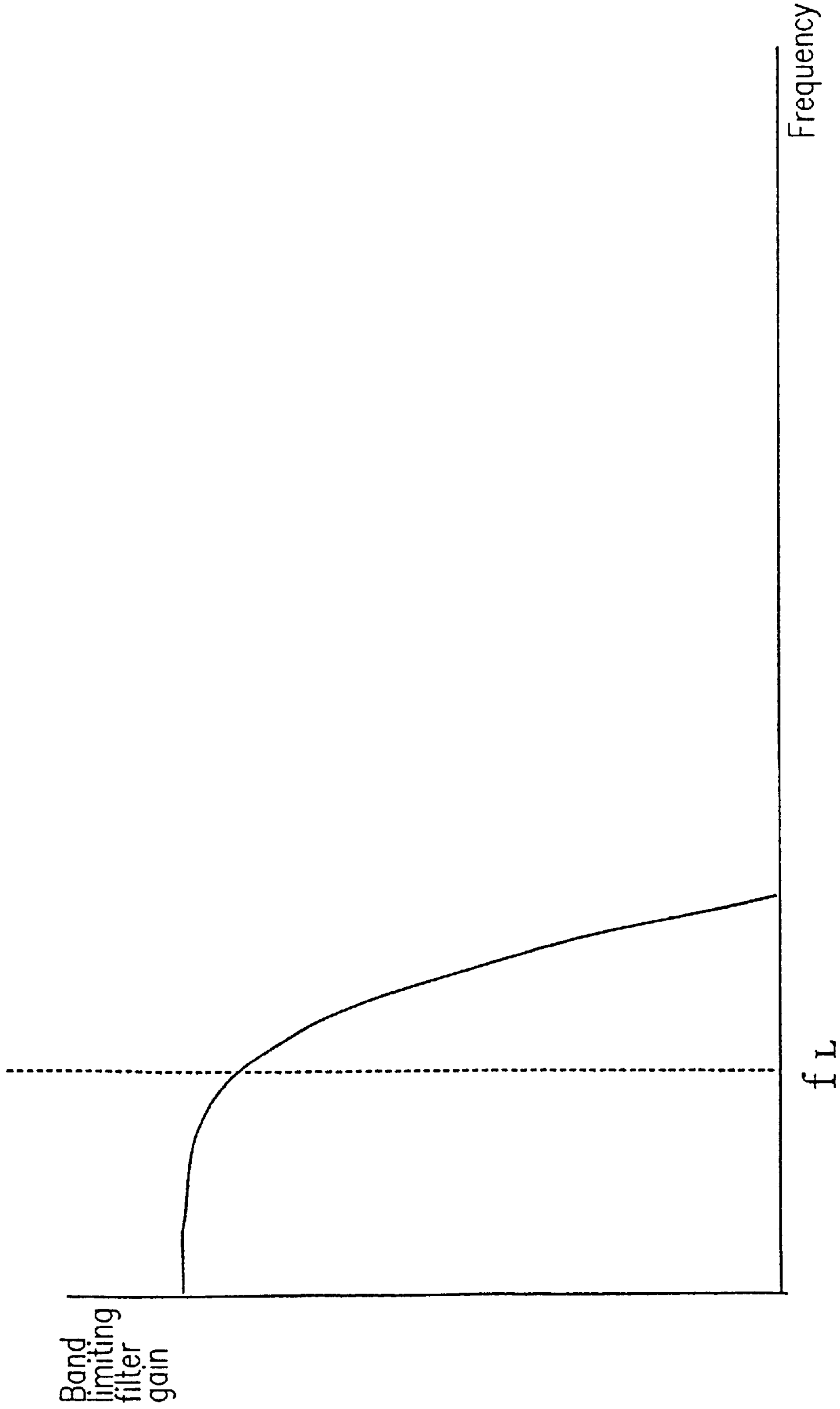
FIG. 8 illustrates a gain-frequency characteristic of digital filters 7 and 8 which are included in the structure of the present invention.

In view of this, in the present embodiment, the digital filters 7 and 8 are set to have a band limiting characteristic with a passband characteristic as illustrated in FIG. 8 in the low frequency region where the output of the control speaker 1 is reduced (e.g., the frequency region where the frequency is less than or equal to the lower limit reproducible frequency $f_L$ of the control speaker 1). Under such a setting, the output signal of the adaptive filter 4 is inverted by the phase inverter 10 and processed by the digital filter 8 so as to obtain an error signal, while processing the output signal of the noise detector 3 by the digital filter 7 and inputting the processed signal as a reference signal to the coefficient update calculator 9. The coefficient update calculator 9 performs a calculation according to Expression (2) to be described later, using an algorithm similar to that of the coefficient update calculator 6. Then, the coefficient of the adaptive filter 4 is updated by both of the coefficient update calculators 6 and 9 using an update calculation according to Expression (3) to be described later.

Figure 9:
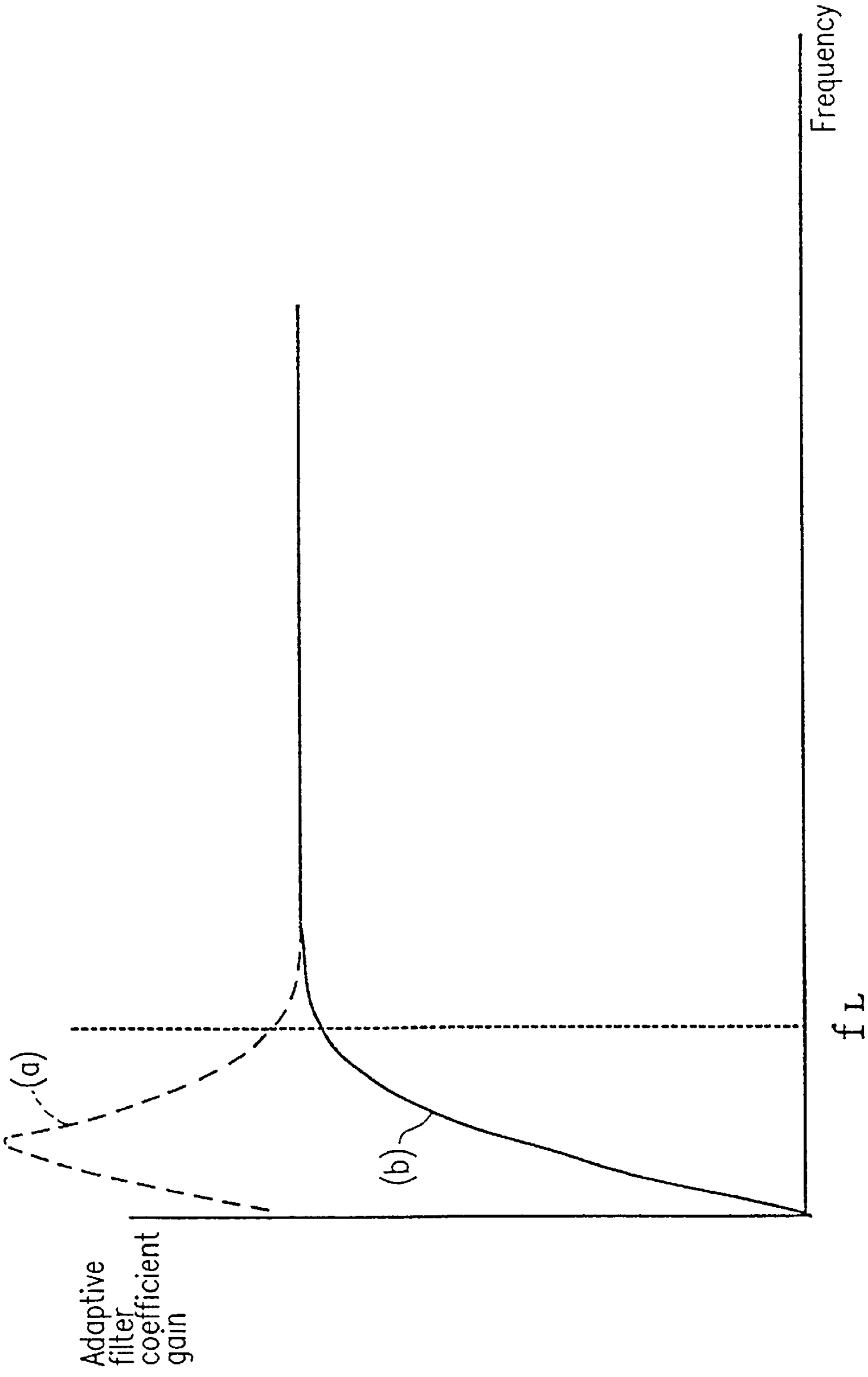
FIG. 9 illustrates a gain-frequency characteristic of the adaptive filter which is obtained by using the entire structure of the present invention.

With the above-described structure, the coefficient update calculator 9 operates so as to reduce the output signal of the digital filter 7, whereby the increase in the coefficient gain of the adaptive filter 4 is suppressed in the low frequency region as illustrated by the solid line (b) in FIG. 9. A broken line (a) in FIG. 9 is a coefficient gain of the adaptive filter 4 which is obtained by using only the coefficient update calculator 6, illustrated in FIG. 3 for updating the coefficient of the adaptive filter 4.

Figure 10:
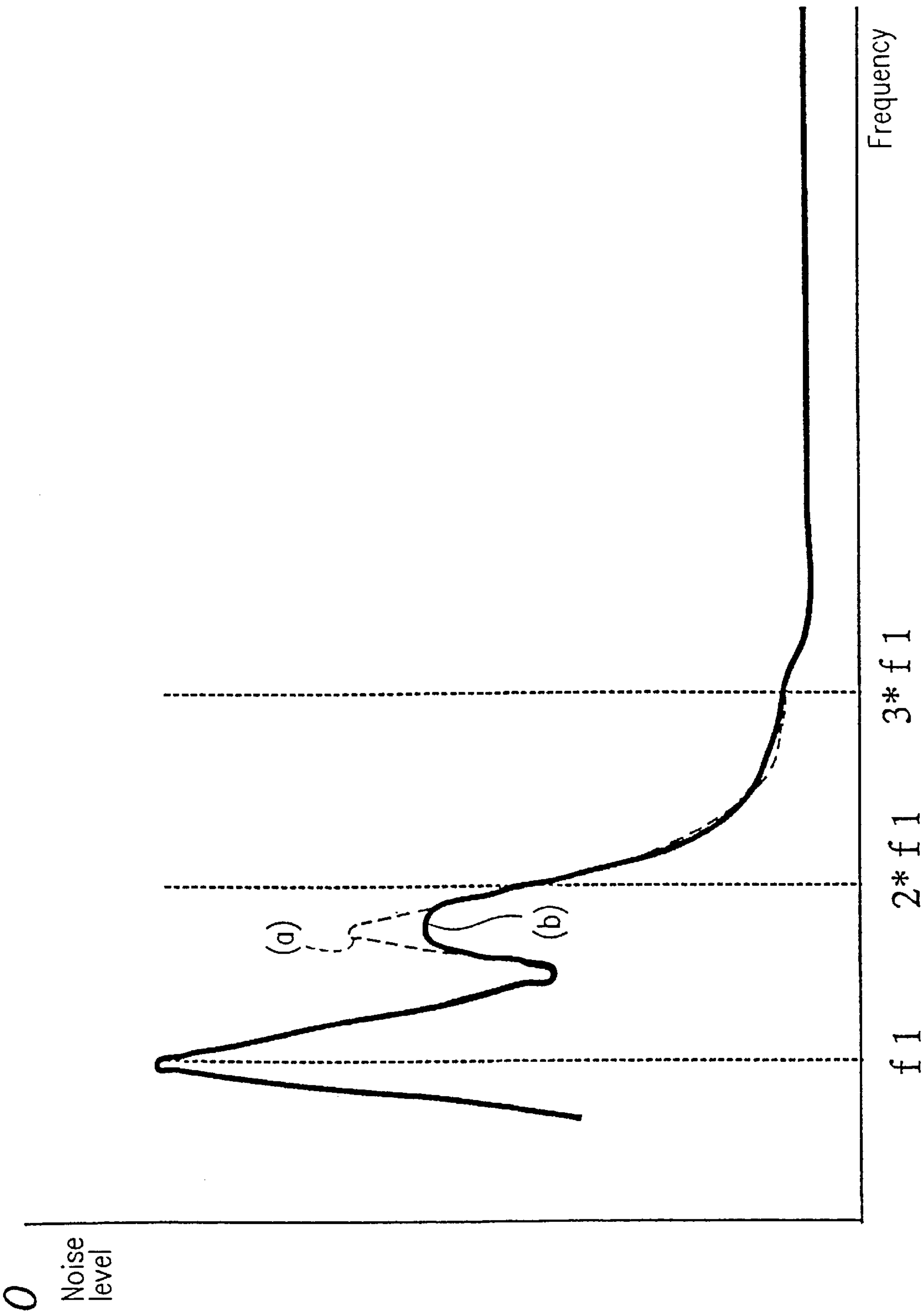
FIG. 10 illustrates a noise control characteristic obtained by the structure of the present invention.

As a result of the above-described suppression of the increase in the coefficient gain in the low frequency region, an excessive low frequency signal is prevented from being input to the control speaker 1, thereby performing a stable noise control within the low frequency reproducibility of the control speaker 1 without inappropriately performing a control at the frequency f1, as illustrated by a solid line (b) in FIG. 10. A broken line (a) in FIG. 10 corresponds to the broken line (a) in FIGS. 4 and 7.

Figure 22:
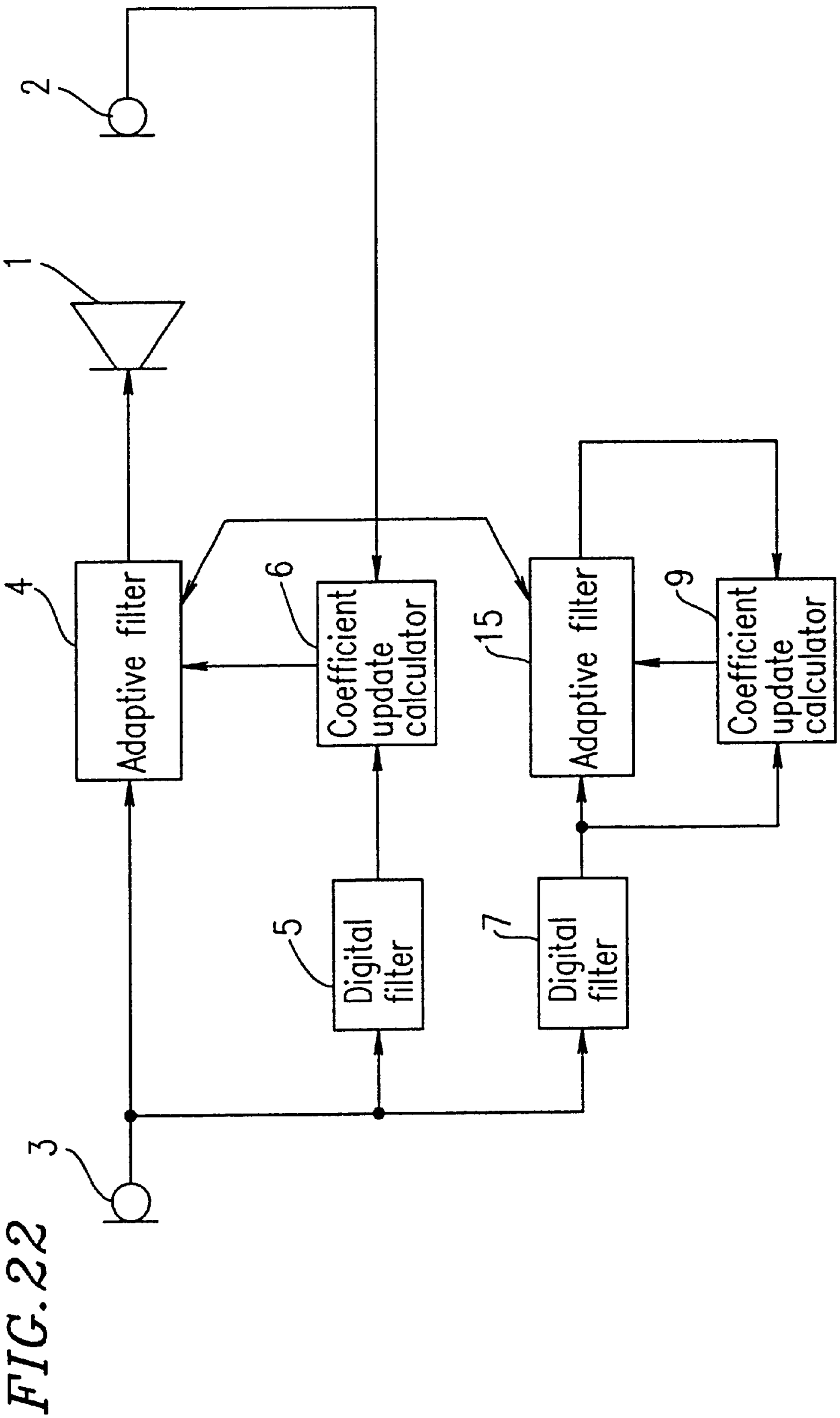
FIG. 22 is a block diagram illustrating a structure of a conventional noise control system.
Figure 23:
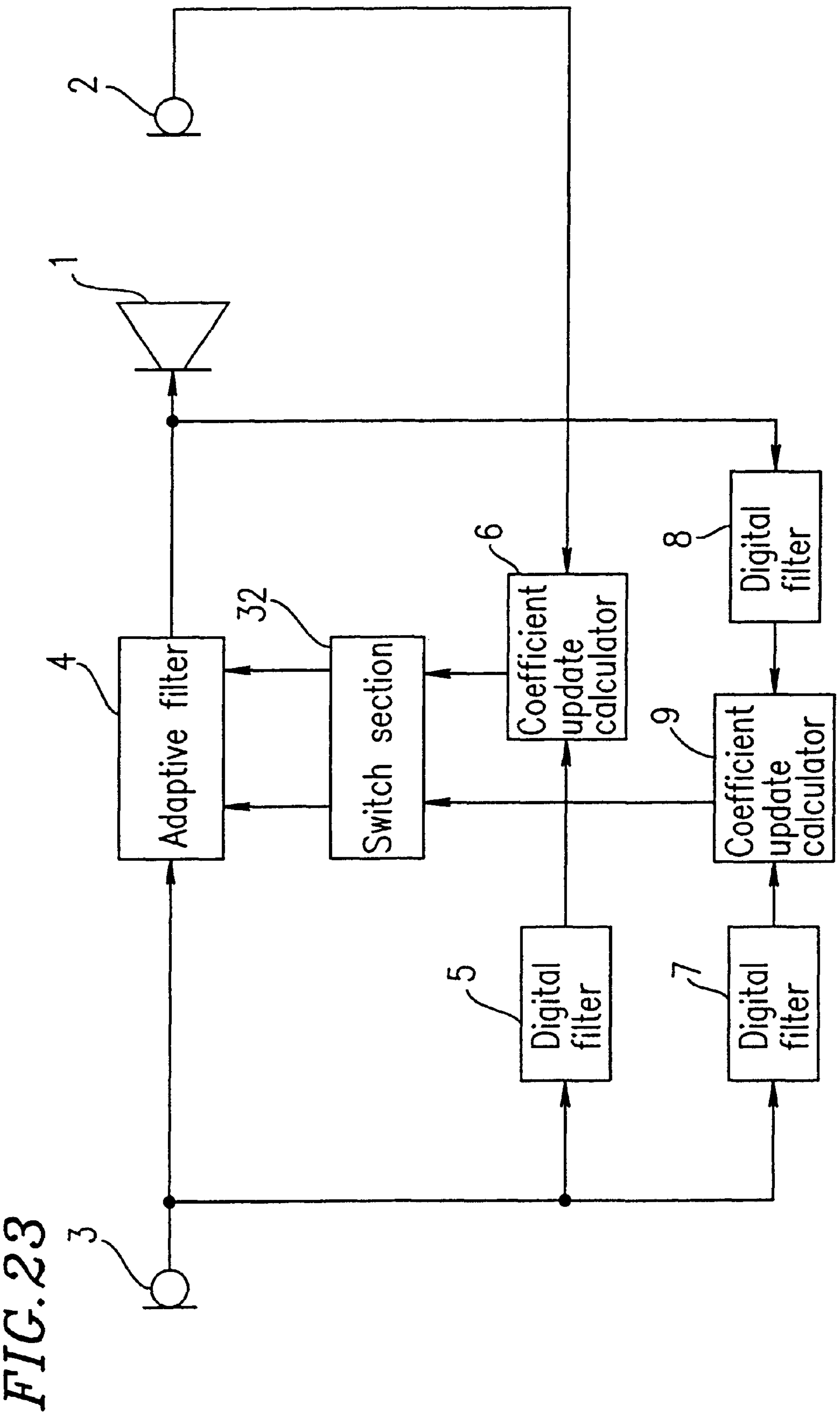
FIG. 23 is a block diagram illustrating a structure of another conventional noise control system.

Moreover, as compared to the conventional structure described above with reference to FIG. 22, where an auxiliary adaptive filter is used, the amount of hardware to be used and the amount of calculation to be performed are reduced with the structure illustrated in FIG. 1.

Expressions (1)–(3) used in the above description are as follows:

$$\Delta W_j = \mu \cdot e_j \cdot R_j \tag{1}$$

$$\Delta U_j = v \cdot v_j \cdot S_j \tag{2}$$

$$W_{j+1} = W_j + \Delta W_j + \Delta U_j \tag{3}$$

where $R_j=(r_j, r_{j-1}, \ldots, r_{j-n-1})$, $W_j=(w(1)_j, w(2)_j, \ldots, w(n)_j)$, and $S_j=(s_j, s_{j-1}, \ldots, s_{j-n-1})^t$.

In these expressions, $\Delta W_j$ denotes an output signal vector of the coefficient update calculator 6, $\Delta U_j$ an output signal vector of the coefficient update calculator 9, $W_j$ a coefficient vector of the adaptive filter 4, $R_j$ an output vector of the digital filter 5, $S_j$ an output signal vector of the digital filter 7, $e_j$ an output signal of the error detector, and $v_j$ an output signal of the digital filter 8, all at time j. Moreover, n denotes the order of the adaptive filter 4, and $\mu$ and v are size parameters for a coefficient update step.

Figure 11:
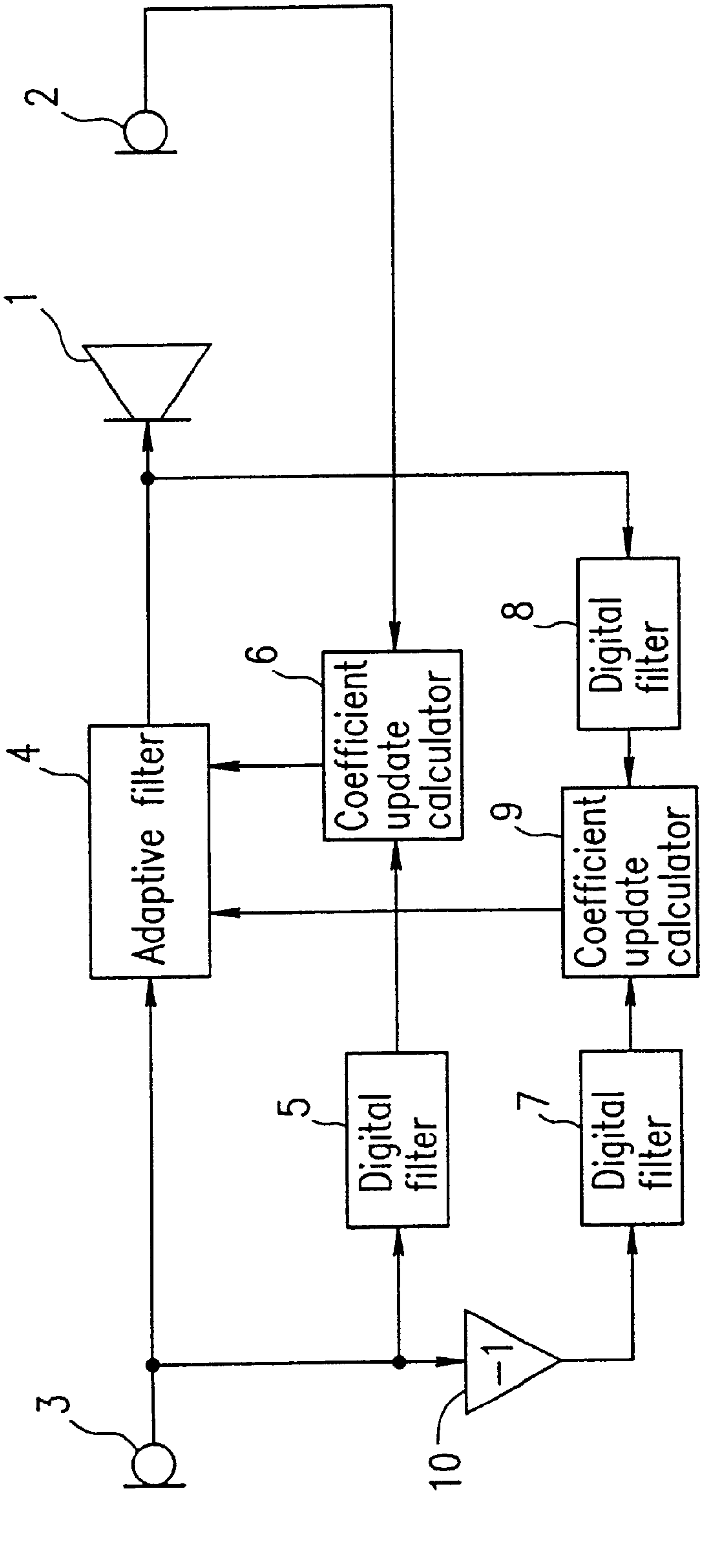
FIG. 11 is a block diagram illustrating a structure of a modified noise control system according to embodiment 1 of the present invention.
Figure 12:
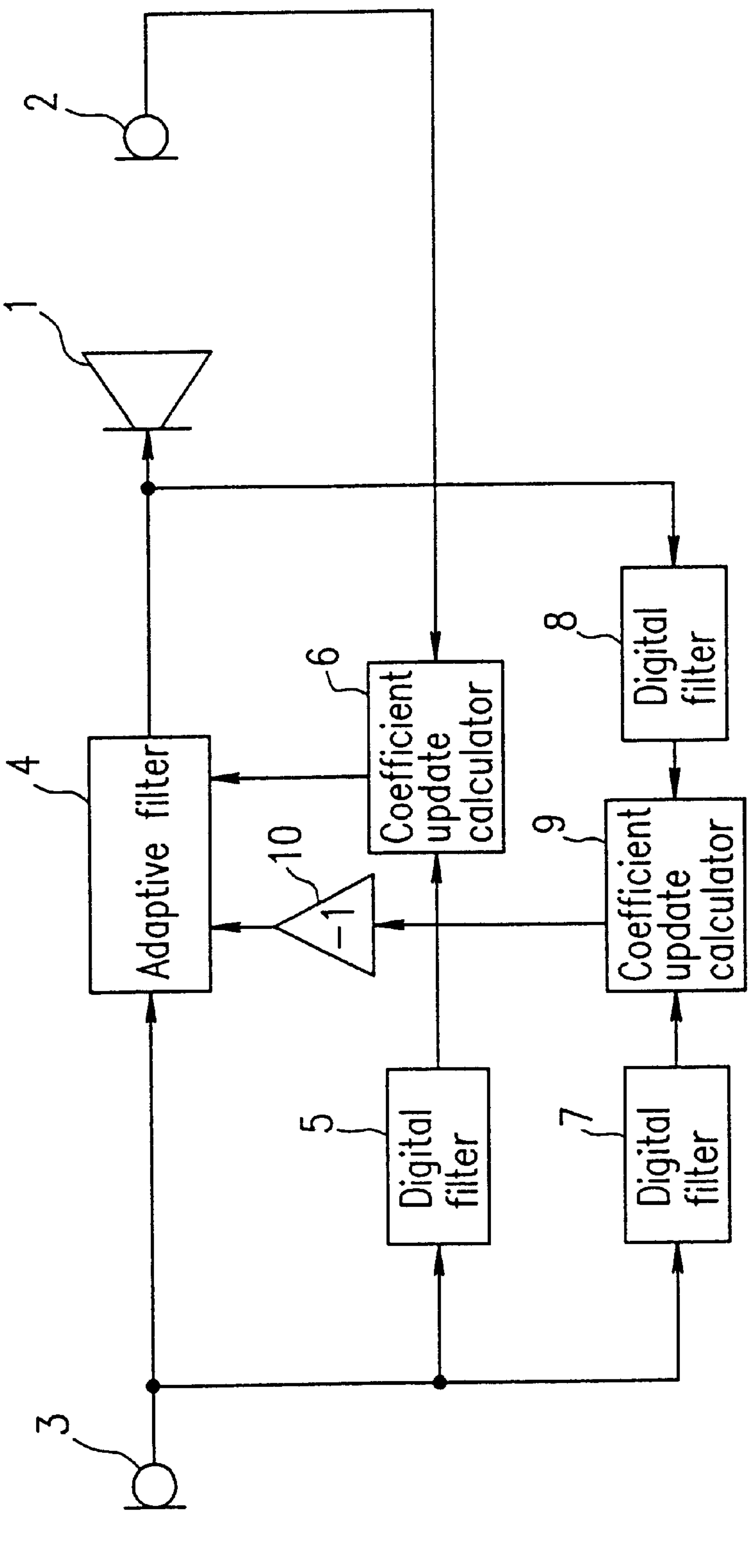
FIG. 12 is a block diagram illustrating a structure of another modified noise control system according to Embodiment 1 of the present invention.

In the above description, the phase inverter 10 is connected between the adaptive filter 4 and the digital filter 8. Functions and effects similar to those described above are also obtained by the structure as illustrated in FIG. 11, where the phase inverter 10 is connected between the noise detector 3 and the digital filter 7. Moreover, functions and effects similar to those described above are also obtained by the structure as illustrated in FIG. 12, where the phase inverter 10 is connected to the output of the coefficient update calculator 9, or by another structure where the phase inverter 10 is connected to the output of the digital filter 8 or the digital filter 7. Elements in the block diagrams of FIGS. 11 and 12 corresponding to those shown in FIG. 1 have like reference numerals, and will not be further described here.

Embodiment 2

A noise control system according to Embodiment 2 of the present invention will be described with reference to FIG. 13.

Figure 13:
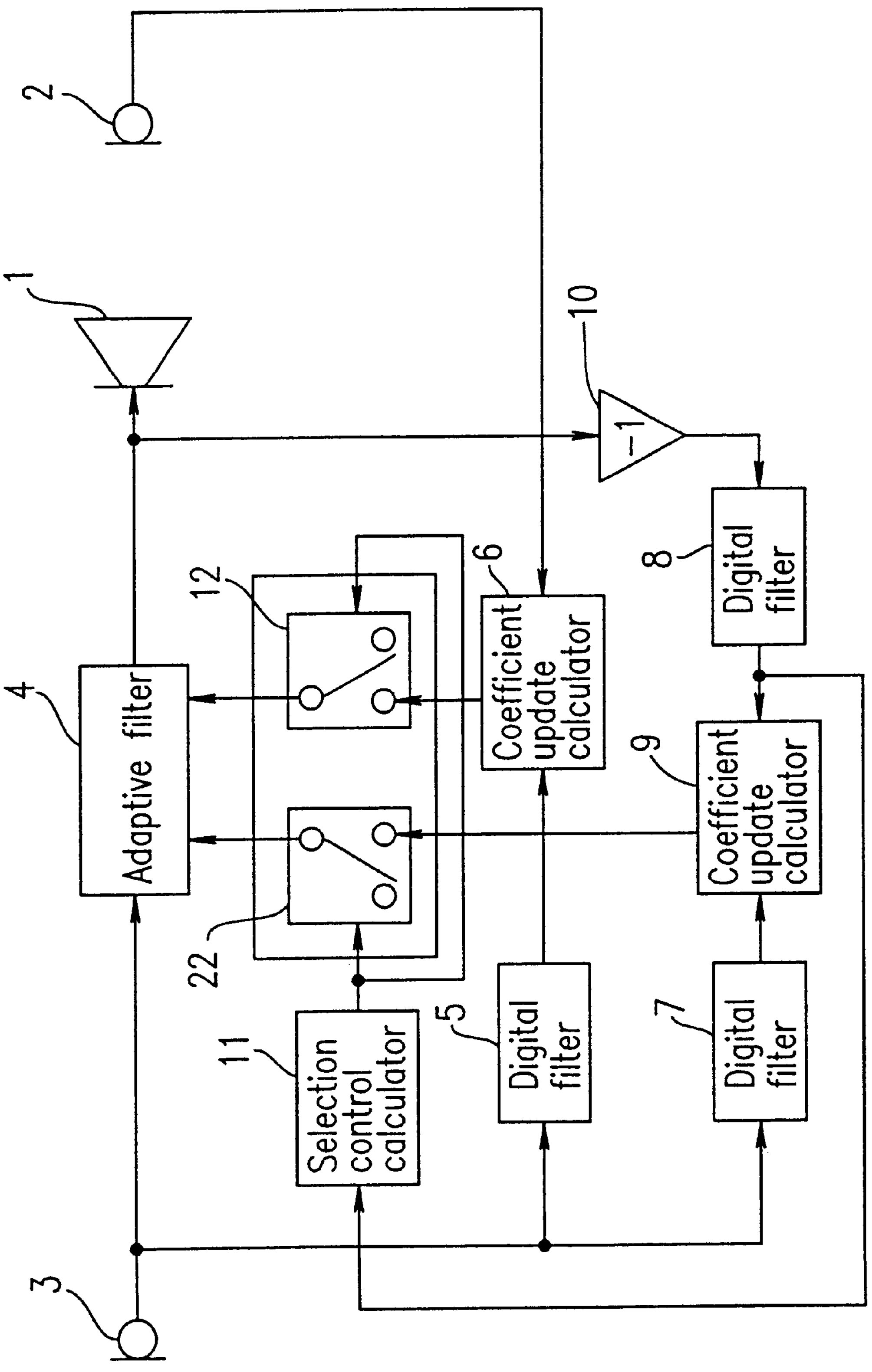
FIG. 13 is a block diagram illustrating a structure of a noise control system according to Embodiment 2 of the present invention.

FIG. 13 is a block diagram illustrating a structure of the noise control system of this embodiment. Elements in the block diagram of FIG. 13 corresponding to those illustrated in Embodiment 1 with reference to, e.g., FIG. 1 have like reference numerals, and will not be further described below.

According to the present embodiment, the update frequency at which the coefficient update calculation is performed by the coefficient update calculator 6 is increased while the low frequency component of the output of the adaptive filter 4 is small and the control speaker 1 is operating in the linear region. On the other hand, the update frequency at which the coefficient update calculation is performed by the coefficient update calculator 9 is increased, when the low frequency component of the output of the adaptive filter 4 increases and the control speaker 1 enters the non-linear region, so as to perform a coefficient update calculation which suppresses the filter gain in the low frequency region. In this way, it is possible not only to sufficiently reduce the noise even in the low frequency region when the noise level is low, but also to perform a stable noise control even when the noise level in the low frequency region is high.

Referring to FIG. 13, the illustrated noise control system includes a selector 12 for thinning out the outputs of the coefficient update calculator 6, another selector 22 for thinning out the outputs of the coefficient update calculator 9, and a selection control calculator 11 for controlling the operations of the selectors 12 and 22. The other elements and the functions thereof are similar to those described above in Embodiment 1. As illustrated in FIG. 13, the selectors 12 and 22, when in the closed position, transfer the outputs of the coefficient update calculators 6 and 9, respectively, to the adaptive filter 4, while selecting no signal (or transferring no signal to the adaptive filter 4) when in the open position. Thus, by closing each of the selectors 12 and 22 at a predetermined timing (frequency), it is possible to control the update frequency at which the outputs of the coefficient update calculators 6 and 9 are selected and transferred to the adaptive filter 4, thereby, in effect, thinning out the outputs of the coefficient update calculators 6 and 9 to be transferred to the adaptive filter 4.

In order to update the coefficient of the adaptive filter 4, a large amount of calculation is required. In the structure illustrated in FIG. 13, not all of the calculation is performed for each occurrence of a sampling operation. Instead, a thinned-out update calculation is employed where a coefficient update operation is performed by each of the selectors 12 and 22 once for a number of sampling operations. The respective thinned-out update frequencies (also referred to as the "thinning-out frequencies") for the selectors 12 and 22 are controlled by the selection control calculator 11.

For example, while the low frequency component of the output of the adaptive filter 4 is at a small level and the control speaker 1 is operating in the linear region, the selector 12 is closed once for 4 sampling operations to control the adaptive filter by the output of the coefficient update calculation 6; and the selector 22 is closed once for 16 sampling operations to control the adaptive filter by the output of the coefficient update calculator 9. Thus, the noise control operation is performed by setting the thinning-out frequency of the selector 22 to be lower than that of the selector 12.

In the structure as illustrated in FIG. 13, a low frequency component of the output signal of the adaptive filter 4 is obtained from the digital filter 8 as an output signal thereof. As described above in Embodiment 1, in the case where the control speaker 1 has a non-linear characteristic in the vicinity of such a low frequency, if the input level exceeds a threshold level Ls, the output sound pressure is saturated (see FIG. 5) while the distortion increases considerably (see FIG. 6), as illustrated in the input-output sound pressure characteristic of FIG. 5 and the input-output sound pressure distortion characteristic of FIG. 6. In such a case, if noise (corresponding to the broken line (a) in FIG. 4) whose spectrum at the error detector (microphone) 2 includes signals in the vicinity of the low frequency f1, as illustrated by the broken line (a) in FIG. 7, is processed with the conventional adaptive filter 4, a sufficient sound elimination cannot be realized because the control sound is saturated at the frequency f1. It may rather lead to generation of a higher harmonic wave distortion at a frequency twice or three times the frequency f1, as illustrated by a solid line (b) in FIG. 7, thereby creating new noise. The distortion may act as an error signal, thereby causing an adverse effect such as making the operation of the adaptive filter 4 unstable.

In view of this, in the present embodiment, the output level of a low frequency component of the output from the digital filter 8 is detected by the selection control calculator 11 and, if the output level exceeds Ls, the thinning-out frequencies of the selectors 12 and 22 are controlled so that the thinning-out frequency of the selector 22 is larger than that of the selector 12. For example, the selector 12 is closed once for 16 sampling operations so as to use the output of the coefficient update calculator 6 for updating the coefficient of the adaptive filter 4 only at this timing, thus controlling the adaptive filter 4 while thinning out the outputs of the coefficient update calculator 6. On the other hand, the selector 22 is closed once for 4 sampling operations so as to use the output of the coefficient update calculator 9 for updating the coefficient of the adaptive filter 4 only at this timing, thus controlling the adaptive filter 4 while thinning out the outputs of the coefficient update calculator 9. As a result, the coefficient of the adaptive filter 4 is updated based on an output of the coefficient update calculator 9 more often than based on an output of the coefficient update calculator 6.

With the above-described structure, the control speaker 1 operates in the linear region when the low frequency component of the control speaker 1 is at a small level, thereby sufficiently controlling noise which contains a low frequency component (e.g., f1), as illustrated by the solid line (b) in FIG. 4. On the other hand, when the level of the low frequency component of the adaptive filter 4 increases and the input to the control speaker 1 exceeds the threshold level Ls to enter the non-linear region, the update operation of the coefficient of the adaptive filter 4 is restricted so as to reduce the low frequency gain. As a result, it is possible to stable control noise without generating a distortion, as illustrated by the solid line (b) in FIG. 10.

Thus, with the noise control system of the present embodiment, it is possible to effectively utilize the linear operability of the control speaker 1 while suppressing the operation thereof in the non-linear region, so as to provide an optimal noise control for low frequency level noise.

Embodiment 3

A noise control system according to Embodiment 3 of the present invention will be described with reference to FIGS. 14 and 15.

Figure 14:
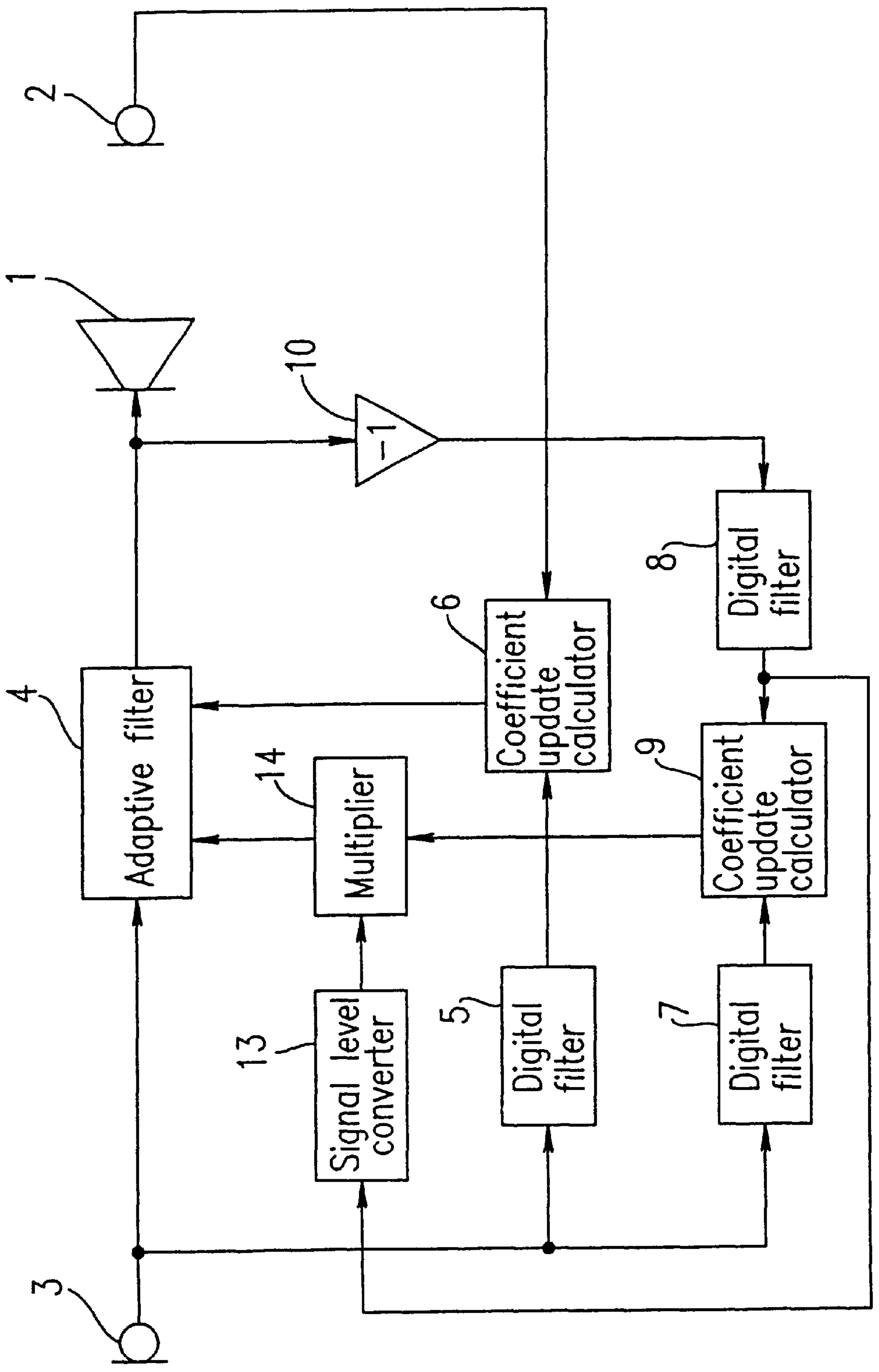
FIG. 14 is a block diagram illustrating a structure of a noise control system according to Embodiment 3 of the present invention.

FIG. 14 is a block diagram illustrating the noise control system of this embodiment. Elements in the block diagram of FIG. 14 corresponding to those illustrated in Embodiment 1 with reference to, e.g., FIG. 1 have like reference numerals, and will not be further described below.

According to the present embodiment, the coefficient of the adaptive filter 4 is updated in an optimal manner according to the level of low frequency noise, in view of the output level of the adaptive filter 4 and the linearity of the control speaker 1. In this way, it is possible not only to sufficiently reduce the noise even in the low frequency region when the noise level is low, but also to perform a stable noise control even when the noise level in the low frequency region is high.

Referring to FIG. 14, the illustrated noise control system includes a signal level converter 13 for receiving a signal output from the digital filter 8 as an input. The output signal form the signal level converter 13 is multiplied by the output from the coefficient update calculator 9 at a multiplier 14 which is provided between the coefficient update calculator 9 and the adaptive filter 4. The other elements and the functions thereof are similar to those described above in Embodiment 1.

In the structure as illustrated in FIG. 14, a low frequency component of the output signal of the adaptive filter 4 is obtained from the digital filter 8 as an output signal thereof. As described above in Embodiment 1, in the case where the control speaker 1 has a non-linear characteristic in the vicinity of such a low frequency, if the input level exceeds a threshold level Ls, the output sound pressure is saturated (see FIG. 5) while the distortion increases considerably (see FIG. 6), as illustrated in the input-output sound pressure characteristic of FIG. 5 and the input-output sound pressure distortion characteristic of FIG. 6. In such a case, if noise (corresponding to the broken line (a) in FIG. 4) whose spectrum at the error detector (microphone) 2 includes signals in the vicinity of the low frequency f1, as illustrated by the broken line (a) in FIG. 7, is processed with the conventional adaptive filter 4, a sufficient sound elimination cannot be realized because the control sound is saturated at the frequency f1. It may rather lead to generation of a higher harmonic wave distortion at a frequency twice or three times the frequency f1, as illustrated by a solid line (b) in FIG. 7, thereby creating new noise. The distortion may act as an error signal, thereby causing an adverse effect such as making the operation of the adaptive filter 4 unstable.

Figure 15:
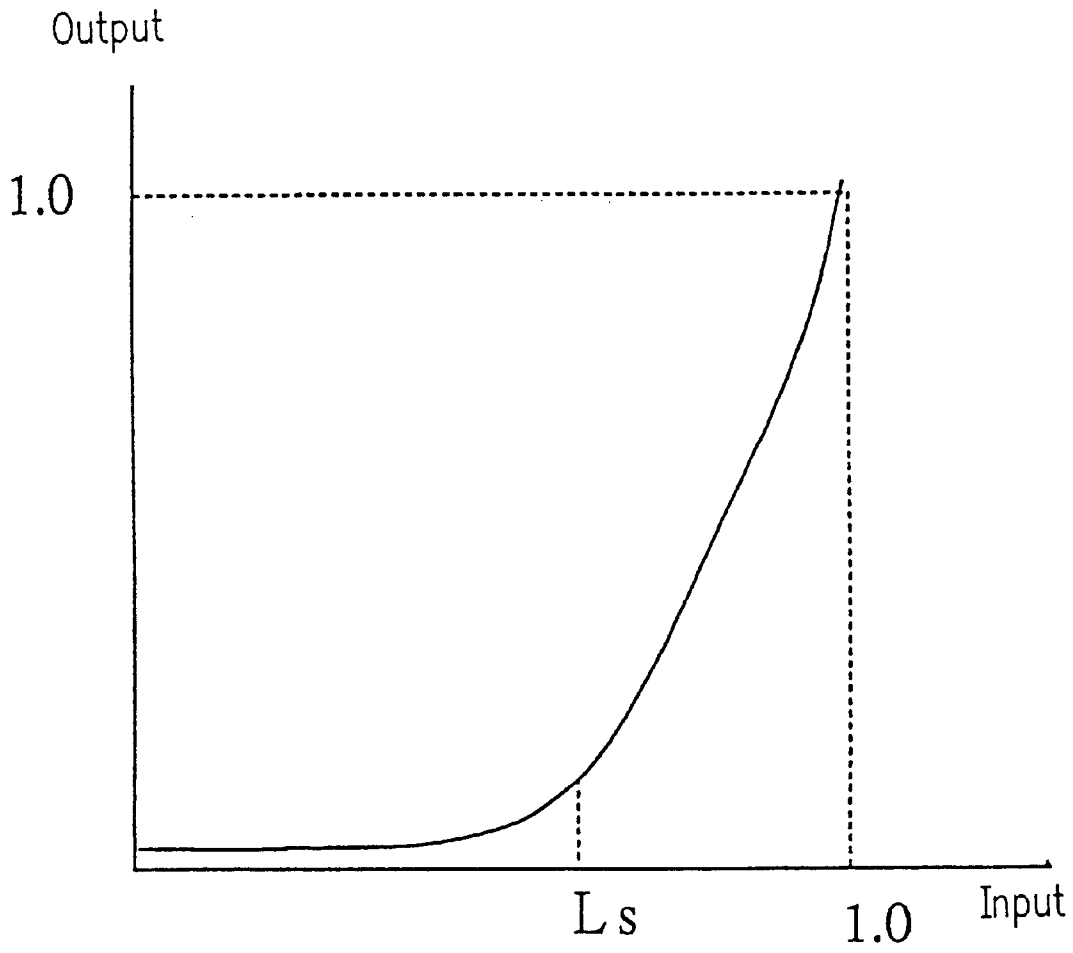
FIG. 15 illustrates an input-output characteristic of a signal level converter which is included in the structure illustrated in FIG. 14.

In view of this, in the present embodiment, the signal level converter 13 detects the level of the output signal from the digital filter 8, and performs a conversion operation for the detected signal level. In particular, the signal level converter 13 converts the level of the signal input thereto (i.e., the output signal from the digital filter 8) according to the input-output characteristic as illustrated in FIG. 15, which is obtained by normalizing the input-output sound pressure distortion characteristic illustrated in FIG. 6. Then, the level-converted output signal is input to the multiplier 14, where it is multiplied by the output signal of the coefficient update calculator 9. As a result, the coefficient of the adaptive filter 4 is updated according to Expression (4) below:

$$W_{j+l}=W_j+\Delta W_j+T(v_j)\cdot\Delta U_j \quad (4)$$

where $T(v_j)$ denotes the input-output characteristic of the signal level converter 13 as illustrated in FIG. 15.

With such a structure, in a region where the control speaker 1 operates linearly and the distortion thereof is small, the output signal of the coefficient update calculator 9 is multiplied by a small value which is output from the signal level converter 13. Thus, the output (the calculation result) from the coefficient update calculator 9 has substantially no influence on the update operation of the coefficient of the adaptive filter 4, so that the coefficient of the adaptive filter 4 is updated according to the output from the coefficient update calculator 6. Moreover, since the control speaker 1 operates in the linear region, it is possible to sufficiently control noise which contains a low frequency component (e.g., f1), as illustrated by the solid line (b) in FIG. 4.

On the other hand, when the level of the low frequency component of the adaptive filter 4 increases and the input to the control speaker 1 exceeds the threshold level Ls to enter the non-linear region, the distortion thereof increases. In such a case, a multiplier factor is set by the signal level converter 13 according to the level of the low frequency output from the control speaker 1, and the output signal of the coefficient update calculator 9 is multiplied by the multiplier factor. As a result, the coefficient of the adaptive filter 4 is updated based on the output (the calculation result) from the coefficient update calculator 9 after the multiplication operation. Thus, a low frequency gain of the adaptive filter 4 is suppressed so as to perform an optimal and stable noise control within the low frequency reproducibility of the control speaker 1 without inappropriately performing a control at the frequency f1, as illustrated by the solid line (b) in FIG. 10.

Embodiment 4

A noise control system according to Embodiment 4 of the present invention will be described with reference to the figures.

In Embodiments 1–3 above, a structure including two coefficient update calculators has been illustrated. In this embodiment, a single coefficient update calculator is used, while a low frequency band of the control signal is limited so that the adaptive filter does not generate an excessive control signal for noise having a frequency which is too low for the low band reproducibility of the control speaker, as in Embodiment 1.

Figure 16:
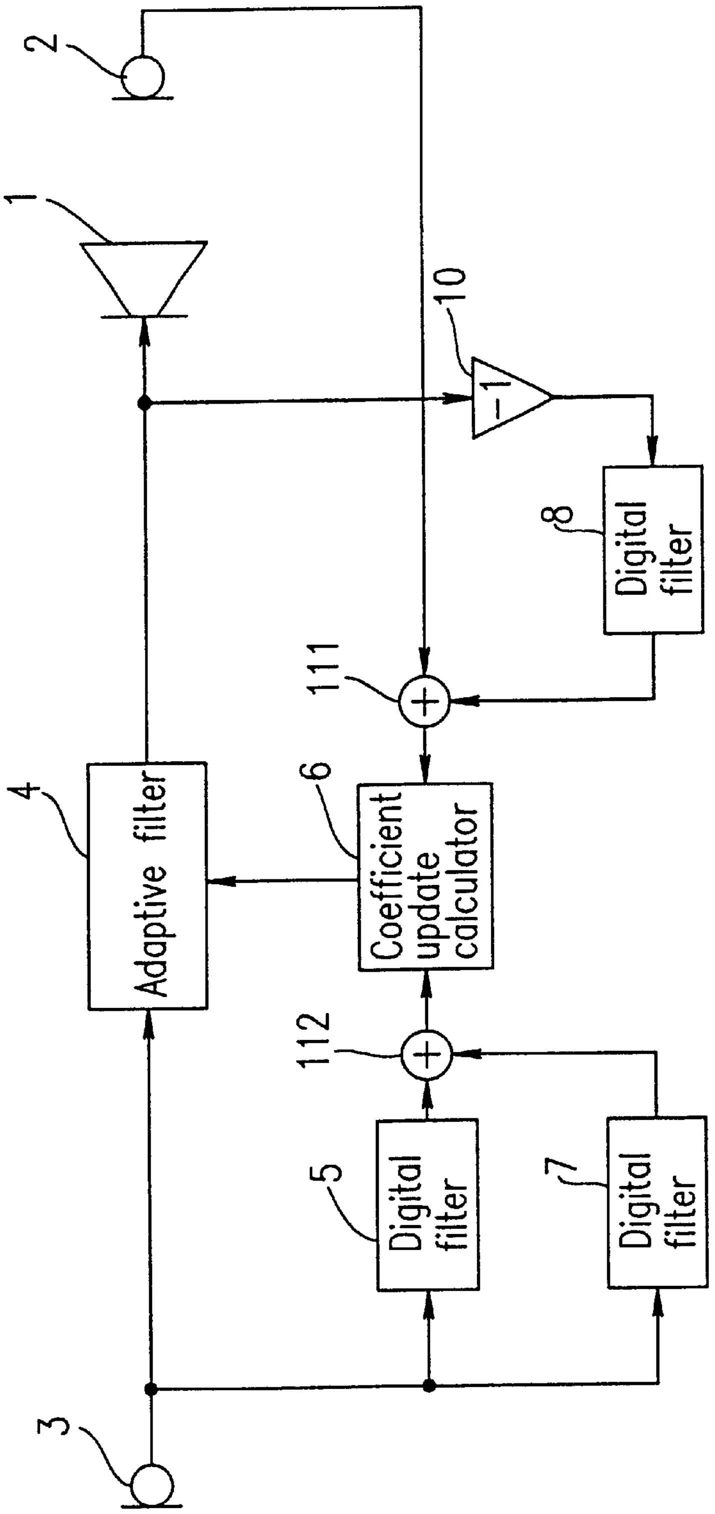
FIG. 16 is a block diagram illustrating a structure of a noise control system according to Embodiment 4 of the present invention.

FIG. 16 is a block diagram illustrating a structure of the noise control system of this embodiment. Referring to FIG. 16, the noise control system includes a control speaker 1, an error detection microphone 2 which functions as an error detector, a noise detection microphone 3 which functions as a noise detector, an adaptive filter 4, a digital filter 5 which approximates the propagation characteristic between the control speaker 1 and the error detection microphone 2, a coefficient update calculator 6, digital filters 7 and 8 each having a frequency band limiting characteristic (band limiting filters), and a phase inverter 10 for inverting the output of the adaptive filter 4. The noise control system of the present embodiment further includes and adder 111 for adding the output of the digital filter 8 and the output of the error detector 2 so as to provide the sum to the coefficient update calculator 6, and another adder 112 for adding the output of the digital filter 5 and the output of the digital filter 7 so as to provide the sum of the coefficient update calculator 6.

With the structure illustrated in FIG. 16, noise generated from a noise source is detected by a noise detector 3, and a noise source signal is generated based on the detection result. The generated noise source signal is processed by the adaptive filter 4, so as to output a control signal. A control sound is generated from the control speaker 1 based on the control signal so that the control sound interferes with the noise from the noise source, thereby reducing the noise.

Moreover, the state of interference between the control sound output from the control speaker 1 and the noise is measured by the error detector (microphone) 2. The output of the error detector (microphone) 2 should ideally be zero as a result of the noise control. Therefore, the coefficient update calculator 6 performs a coefficient update calculation as previously described in Expression (1) based on a filtered X-LMS method (see Widrow and Stearns, "Adaptive Signal Processing", 1985), or the like, so as to adjust the characteristic of the adaptive filter 4, such that the output signal of the error detector (microphone) 2 is reduced. This changes the control sound actually generated from the control speaker 1, thereby further reducing the noise.

Typically, the frequency characteristic of the control speaker 1 is such that the sound pressure of an output thereof is reduced in a frequency region where the frequency is less than or equal to the lower limit reproducible frequency $f_L$, as shown in FIG. 2. For example, where noise has a spectrum which includes such a low frequency region, if only the coefficient update calculator 6 is used for updating the coefficient of the adaptive filter 4, the coefficient gain of the adaptive filter 4 sufficiently reduces (or cancels) the noise in the low frequency region while compensating for the characteristic of the control speaker 1, thereby converging into the characteristic as illustrated in FIG. 3, where the gain has an increase in the low frequency region (a region where the frequency is less than or equal to the lower limit reproducible frequency $f_L$ of the control speaker 1). In such a case, a large low frequency signal is input to the control speaker 1.

In a region where the linearity of the control speaker is maintained, even if the noise spectrum at the error detector (microphone) 2 includes signals in the vicinity of the low frequency f1 as illustrated by the broken line (a) in FIG. 4, the peak of the noise level is cut down, as illustrated by the solid line (b) in FIG. 4, thereby realizing an appropriate sound eliminating operation.

However, where the control speaker 1 has a non-linear characteristic in the vicinity of such a low frequency, if the input level exceeds a threshold level Ls, the output sound pressure is saturated see (see FIG. 5) while the distortion increases considerably (see FIG. 6), as illustrated in the input-output sound pressure characteristic of FIG. 5 and the input-output sound pressure distortion characteristic of FIG. 6. In such a case, if noise (corresponding to the broken line (a) in FIG. 4) whose spectrum at the error detector (microphone) 2 includes signals in the vicinity of the low frequency f1, as illustrated by the broken line (a) in FIG. 7, is processed with the conventional adaptive filter 4, a sufficient sound elimination cannot be realized because the control sound is saturated at the frequency f1. It may rather lead to generation of a higher harmonic wave distortion at a frequency twice or three times the frequency f1, as illustrated by the solid line (b) in FIG. 7, thereby creating new noise. The distortion may act as an error signal, thereby causing an adverse effect such as making the operation of the adaptive filter 4 unstable.

Figure 17:
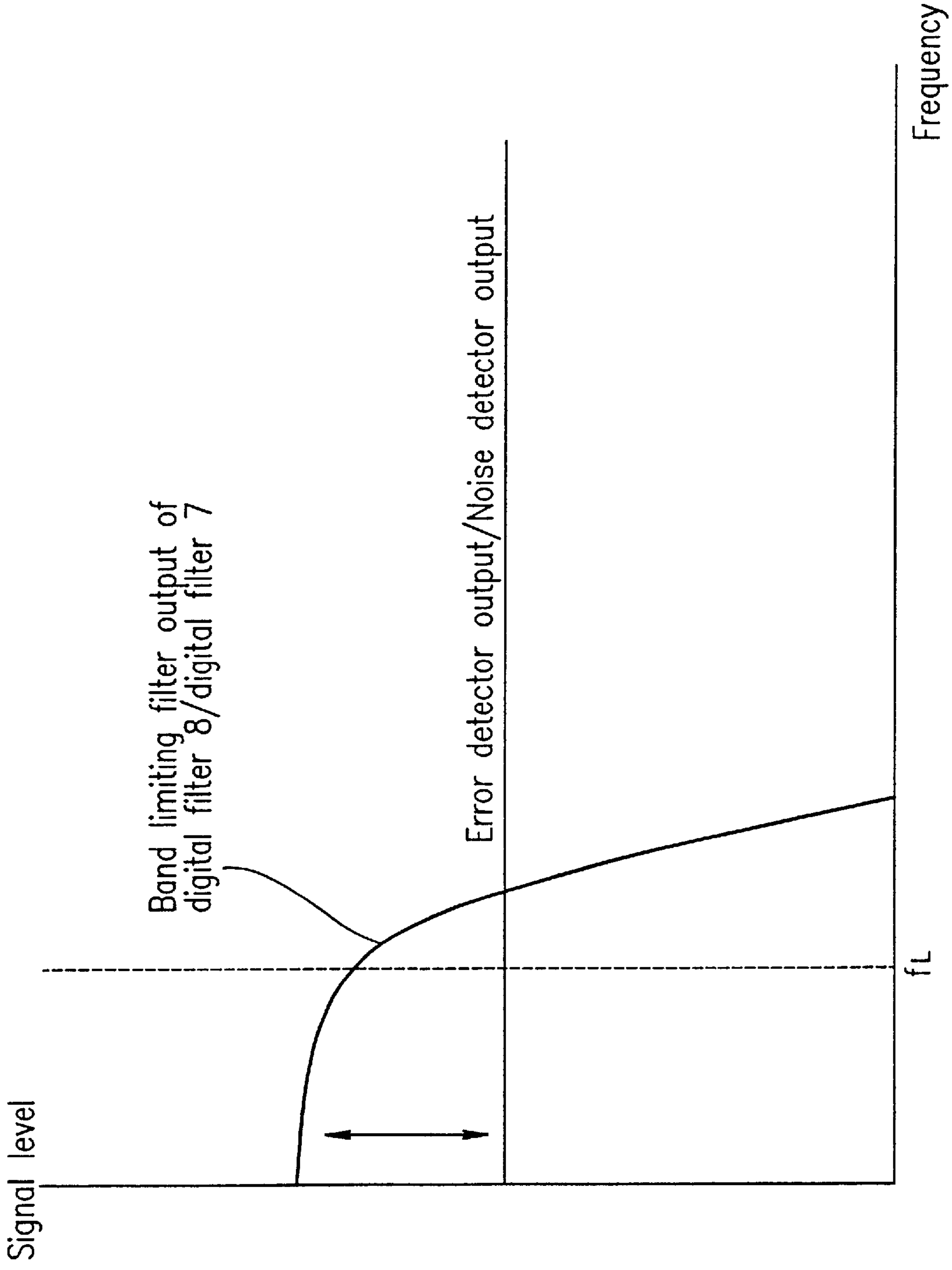
FIG. 17 illustrates a gain-frequency characteristic of the digital filters 7 and 8 which are included in the structure illustrated in FIG. 16.

In view of this, in the present embodiment, the digital filters 7 and 8 are set to have a band limiting characteristic with a passband characteristic as illustrated in FIG. 17 in the low frequency region where the output of the control speaker 1 is reduced (e.g., the frequency region where the frequency is less than or equal to the lower limit reproducible frequency $f_L$ of the control speaker 1). Under such a setting, the output signal of the adaptive filter 4 is inverted by the phase inverter 10 and processed by the digital filter 8. The resulting signal is added to the error detection signal by the adder 111, and the sum is input to the coefficient update calculator 6. On the other hand, the output signal of the noise detector 3 is process by the digital filter 7. The resulting signal is added to the output signal of the digital filter 5 by the adder 112, and the sum is input to the coefficient update calculator 6. The gain in the passband of the digital filter 7 is set to be larger than the output signal level of the digital filter 5. Similarly, the gain in the passband of the digital filter 8 is set to be larger than the output signal level of the error detector.

In the present embodiment, the following expressions are satisfied:

$$e\_all_j = e_j + v_j, \text{ and}$$

$$r\_all_j = R_j + S_j$$

where e_all denotes an output signal of the adder 111; and r_all denotes an output signal of the adder 112.

On the other hand, the output $\Delta W\_all_j$ of the coefficient update calculator 6 can be expressed as follows:

$$\Delta W\_all_j = \mu * e\_all_j * r\_all_j$$
$$= \mu * (e_j + v_1) * (R_j + S_j).$$

Since $R_j >> S_j$ and $e_j >> v_j$ in the stopbands of the digital filter 7 and the digital filter 8, the above expression can be substantially expressed as $$\Delta W\_all_j = \mu \cdot V_j \cdot R_j,$$

and the following calculation $$W_{j+1} = W_j + \Delta W\_all_j$$

is performed. Thus, a positive coefficient update operation is performed.

On the other hand, since the signal levels in the passbands of the digital filter 7 and the digital filter 8 are such that $R_j > S_j$ and $e_j > v_j$ due to the above-described setting, the above expression can be substantially expressed as $$\Delta W\_all_j = \mu \cdot v_j \cdot_{Sj},$$

and the following calculation $$W_{j+1} = W_j + \Delta W\_all_j$$

is performed. Thus, a negative coefficient update operation is performed.

In the above description, the following terms are used:

$R_j = (r_j, r_{j-i}, \ldots, r_{j-n-1})$, $W_j = (w(1)_j, w(2)_j, \ldots, w(n)_j)$, and $S_j = (s_j, s_{j-i}, \ldots, S_{j-n-1})^T$.

In these expressions, $\Delta W\_all_j$ denotes an output signal vector of the coefficient update calculator 6, $W_j$ a coefficient vector of the adaptive filter 4, $R_j$ an output vector of the digital filter 5, $S_j$ an output signal vector of the digital filter 7, $e_j$ and output signal of the error detector, and $v_j$ and output signal of the digital filter 8, all the time j. Moreover, n denotes the order of the adaptive filter 4, and $\mu$ is a size parameter for a coefficient update step.

By the operation of the coefficient update calculator 6 in the above-described structure, an increase in the coefficient gain of the adaptive filter 4 in the passbands of the digital filter 7 and the digital filter 8 is suppressed in the low frequency band, as illustrated by the solid line (b) in FIG. 9. With the structure of the present embodiment, the amount of calculation to be performed and the amount of hardware to be used can be reduced, because only one coefficient update calculator is required. The broken line (a) in FIG. 9 is a coefficient gain of the adaptive filter 4 which is obtained by using only the output of the digital filter 5 and the output of the error detector 2 for updating the coefficient of the adaptive filter 4.

As a result of the above-described suppression of the increase in the coefficient gain in the low frequency region, an excessive low frequency signal is prevented from being input to the control speaker 1, thereby performing a stable noise control within the low frequency reproducibility of the control speaker 1 without inappropriately performing a control at the frequency f1, as illustrated by the solid line (b) in the FIG. 10. The broken line (a) in FIG. 10 corresponds to the broken line (a) in FIGS. 4 and 7.

Moreover, as compared to the conventional structure described above with reference to FIG. 22, where an auxiliary adaptive filter is used, the amount of hardware to be used and the amount of calculation to be performed are reduced with the structure illustrated in FIG. 16.

Figure 18:
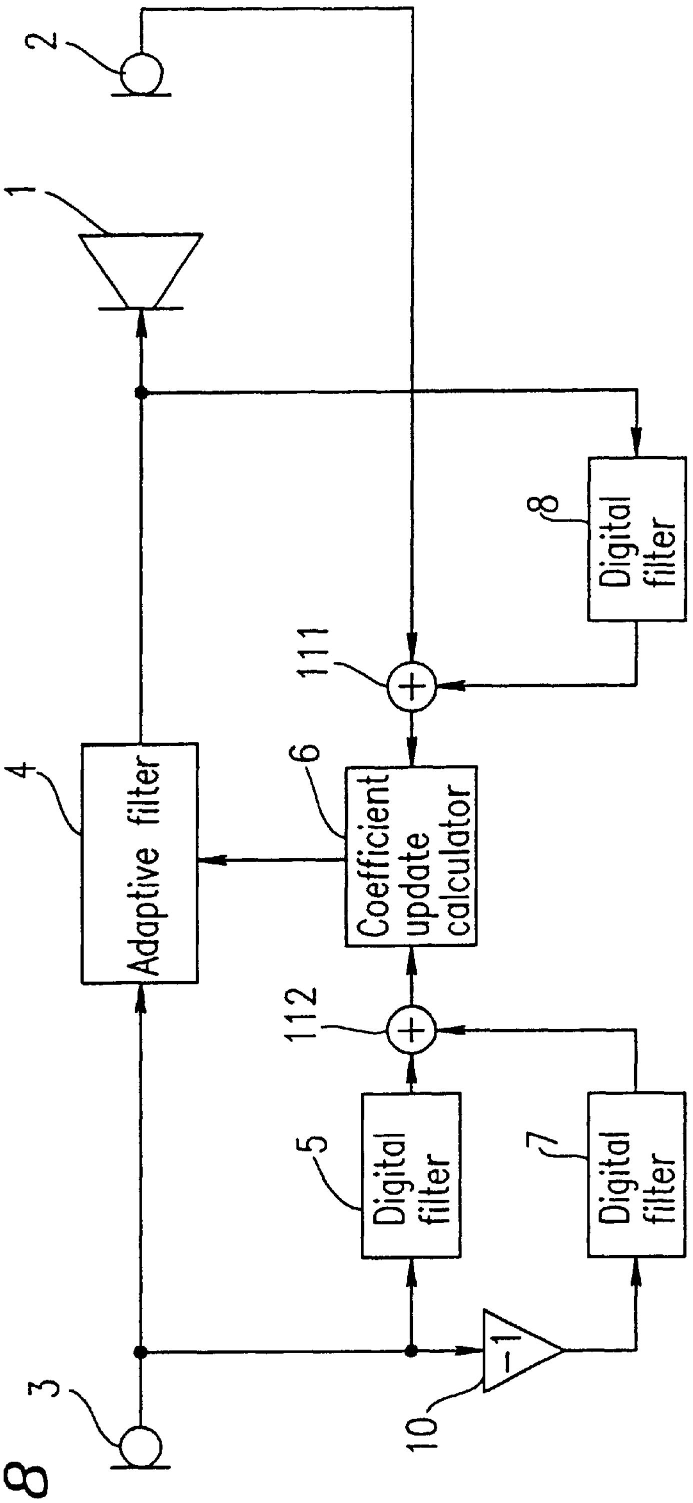
FIG. 18 is a block diagram illustrating a structure of a modified noise control system according to Embodiment 4 of the present invention.

In the above description, the phase inverter 10 is connected between the adaptive filter 4 and the digital filter 8. Functions and effects similar to those described above are also obtained by the structure as illustrated in FIG. 18, where the phase inverter 10 is connected between the noise detector 3 and the digital filter 7. Moreover, functions and effects similar to those described above are also obtained by a structure where the phase inverted 10 is connected to the output of the digital filter 8 or the digital filter 7.

Figure 19:
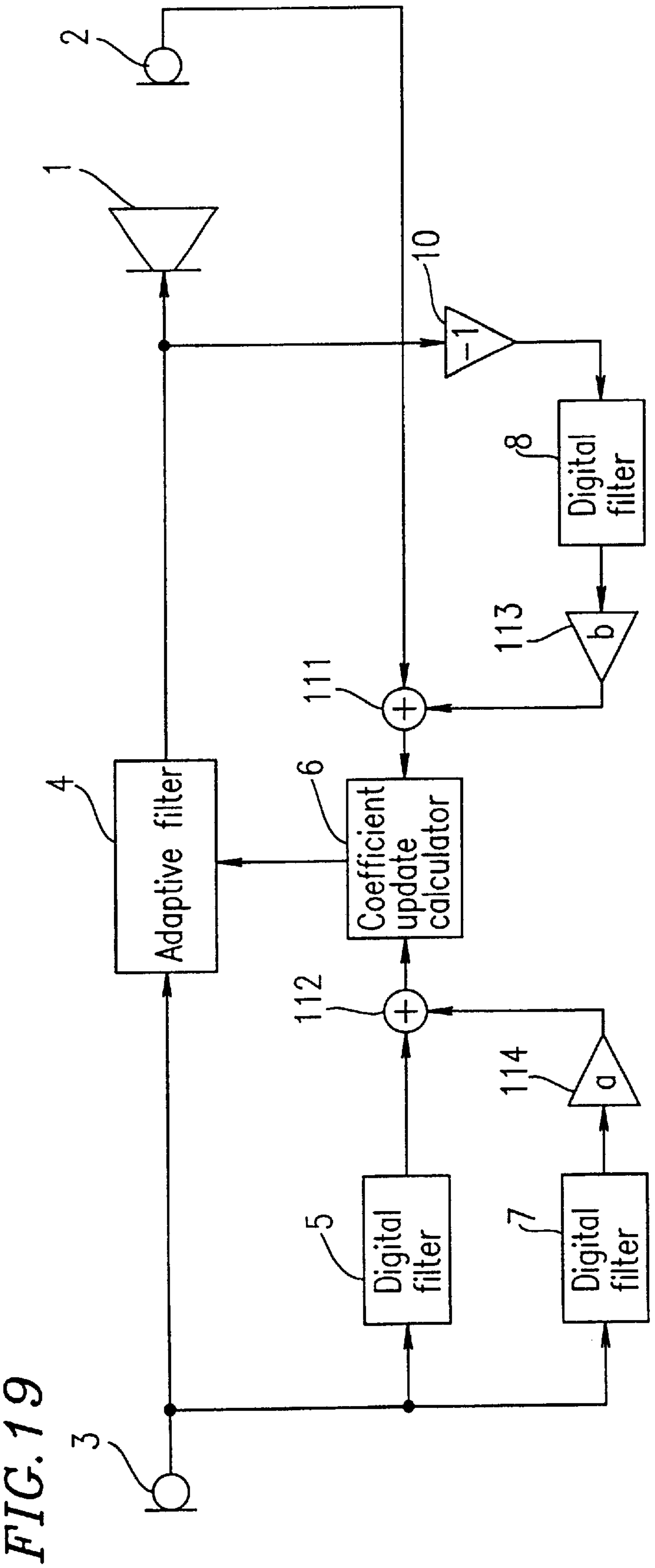
FIG. 19 is a block diagram illustrating a structure of another modified noise control system according to Embodiment 4 of the present invention.

Furthermore, while a structure where the gain in the passbands of the digital filters 7 and 8 is set has been described above, in the case of performing a calculation by using an ordinary digital signal processor, effects similar to those described above may be obtained by a structure as illustrated in FIG. 19, which is provided with further coefficient controllers 113 and 114 which utilize bit shifting, or the like, to set a gain equal to or greater than 1. Specifically, in the structure illustrated in FIG. 19, the coefficient controller 113 having a gain of b>1 is provided to the output of the digital filter 8, and the coefficient controller 114 having a gain of a>1 is provided to the output of the digital filter 7.

Figure 20:
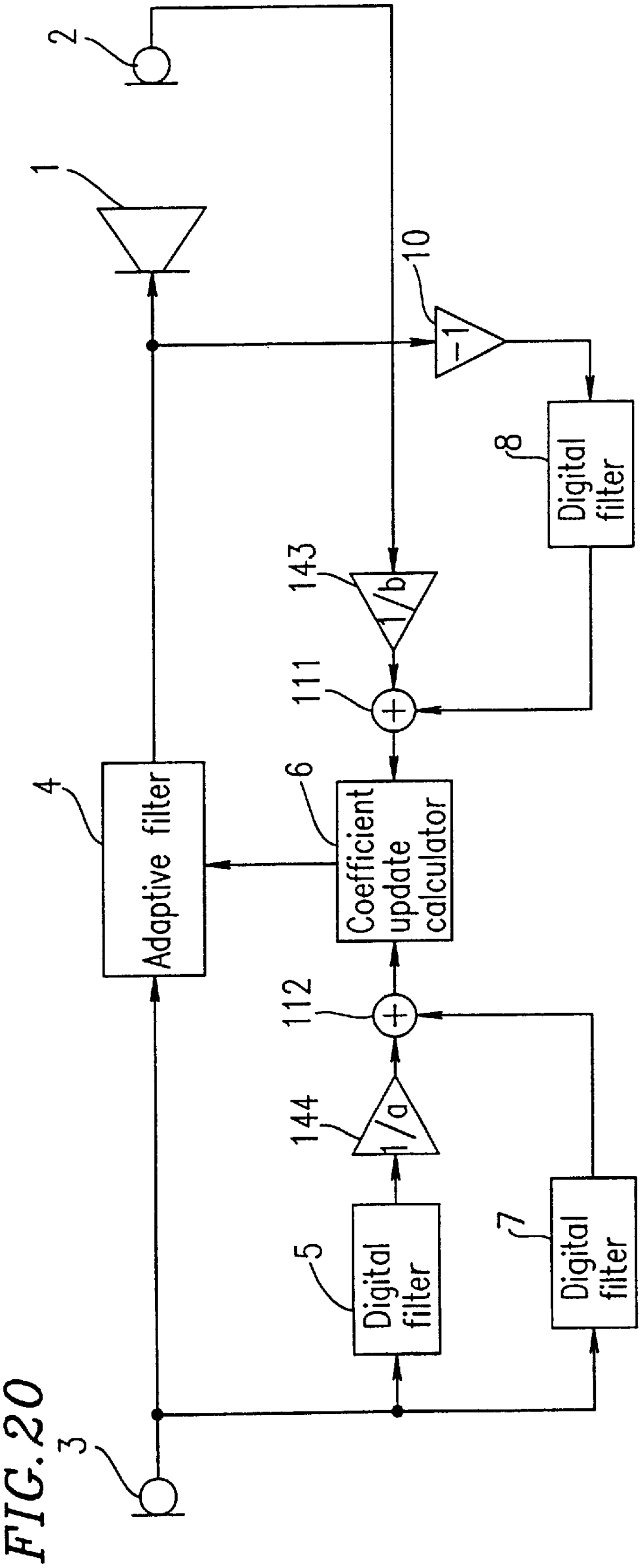
FIG. 20 is a block diagram illustrating a structure of still another modified noise control system according to Embodiment 4 of the present invention.

Moreover, in the above description, a structure for increasing the gains of the digital filters 7 and 8 has been illustrated. However, in order to set a relative gain relationship as illustrated in FIG. 17, a coefficient controller 144 having a gain of 1/a>1 may be provided to the output of the digital filter 5, while providing another coefficient controller 143 having a gain of 1/b>1 to the output signal of the error detector 2, as illustrated in FIG. 20. With such a structure, it is possible to provide the coefficient update calculator 6 with a signal whose frequency band, in which a relatively negative coefficient update is performed, is emphasized.

Elements in the block diagrams of FIGS. 18 to 20 corresponding to those described previously with reference to FIG. 1 have like reference numerals, and will not be further described here.

Embodiment 5

A noise control system according to Embodiment 5 of the present invention will be described with reference to FIG. 21.

Figure 21:
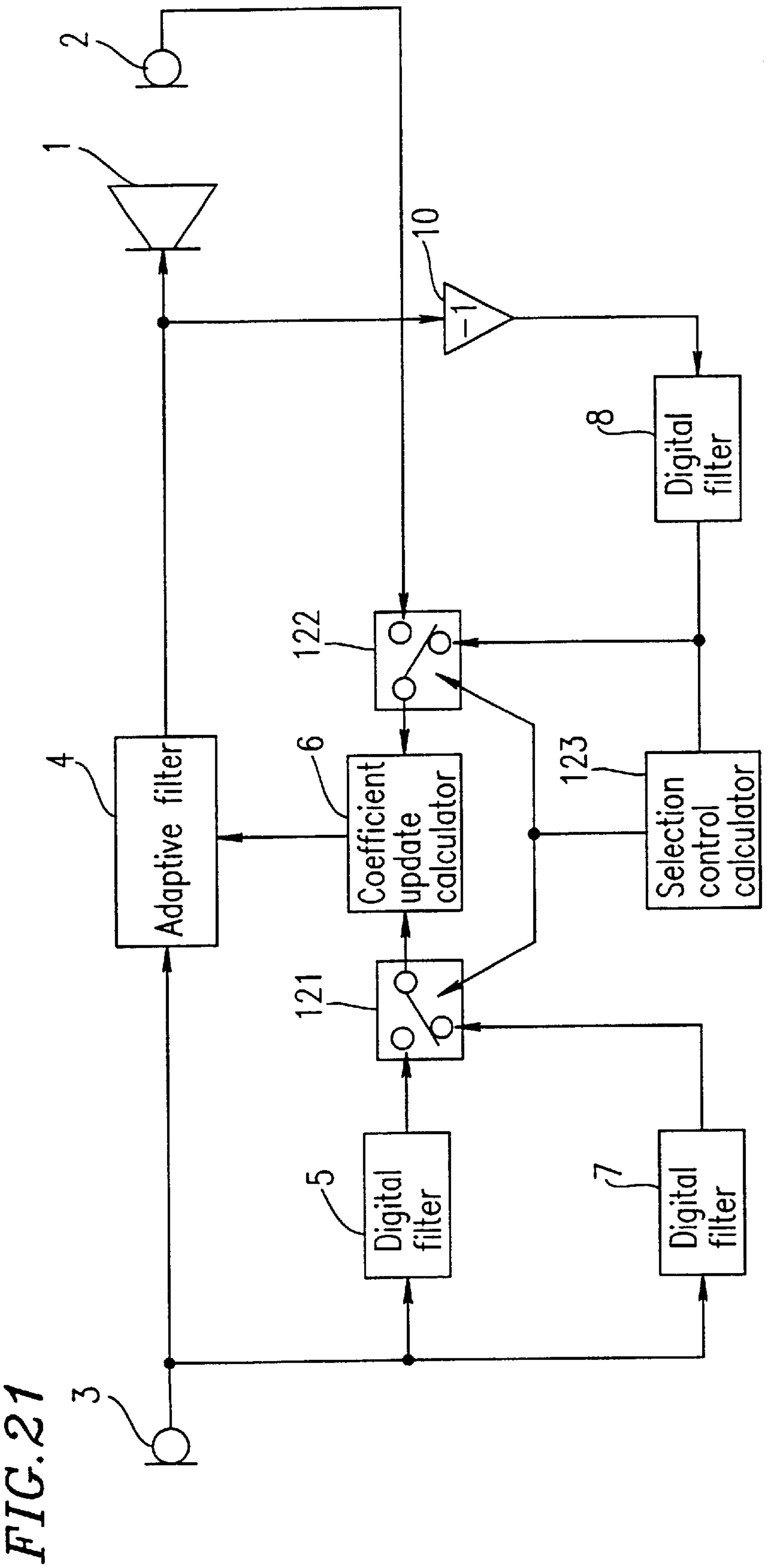
FIG. 21 is a block diagram illustrating a structure of a noise control system according to Embodiment 5 of the present invention.

FIG. 21 is a block diagram illustrating a structure of the noise control system of this embodiment. Elements in the block diagram of FIG. 21 corresponding to those illustrated in the previous Embodiments with reference to, e.g., FIG. 1 have like reference numerals, and will not be further described below.

According to the present embodiment, a coefficient update calculation as described above in Embodiment 1 is performed when the low frequency component of the output of the adaptive filter 4 is at a small level and the control speaker 1 is operating in the linear region. On the other hand, a coefficient update calculation which suppresses the filter gain in the low frequency region is performed when the low frequency component of the output of the adaptive filter 4 increases and the control speaker 1 enters the non-linear region. In this way, it is possible not only to sufficiently reduce the noise even in the low frequency region when the noise level is low, but also to perform a stable noise control even when the noise level in the low frequency region is high.

The noise control system illustrated in FIG. 21 includes a selector 121 for selecting one of the output of the digital filter 5 and the output of the digital filter 7, another selector 122 for selecting one of the output of the digital filter 8 and the output of the error detector 2, and a selection control calculator 123 for controlling the operations of the selectors 121 and 122. The other elements and the functions thereof are similar to those described above in Embodiment 1.

In the structure as illustrated in FIG. 21, a low frequency component of the output signal of the adaptive filter 4 is obtained from the digital filter 8 as an output signal thereof. As described above in Embodiment 1 or Embodiment 4, in the case where the control speaker 1 has a non-linear characteristic in the vicinity of such a low frequency, if the input level exceeds a threshold level Ls, the output sound pressure is saturated (see FIG. 5) while the distortion increases considerably (see FIG. 6), as illustrated in the input-output sound pressure characteristic of FIG. 5 and the input-output sound pressure distortion characteristic of FIG. 6. In such a case, if noise (corresponding to the broken line (a) in FIG. 4) whose spectrum at the error detector (microphone) 2 includes signals in the vicinity of the low frequency f1, as illustrated by the broken line (a) in FIG. 7, is processed with the conventional adaptive filter 4, a sufficient sound elimination cannot be realized because the control sound is saturated at the frequency f1. It may rather lead to generation of a higher harmonic wave distortion at a frequency twice or three times the frequency f1, as illustrated by a solid line (b) in FIG. 7, thereby creating new noise. The distortion may act as an error signal, thereby causing an adverse effect such as making the operation of the adaptive filter 4 unstable.

In view of this, in the present embodiment, the selection control calculator 123 is used to detect the output level of the low frequency component in the output from the digital filter 8. If the output level exceeds a predetermined level Ls, the selector 122 is controlled by the selection control calculator 123 so as to select the output of the digital filter 8. The selector 121 is controlled by the selection control calculator 123 so as to select the output of the digital filter 7. Thus, the coefficient update calculator 6 performs the following calculations $$\Delta W\_all_j = \mu \cdot v_j \cdot S_j, \text{ and}$$

$$W_{j+1} = W_j + \Delta W\_all_j,$$

and updates the coefficient of the adaptive filter 4 in the negative direction based on the calculation result.

Otherwise, while the output level of the low frequency component from the digital filter 8 is smaller than the predetermined levels Ls, the selection control calculator 123 controls the selector 121 to select the output of the digital filter 5 and the selector 122 to select the output of the error detector 2. Thus, the coefficient update calculator 6 performs the following calculations $$\Delta W\_all_j = \mu \cdot v_j \cdot R_j, \text{ and}$$

$$W_{j+1} = W_j + \Delta W\_all_j,$$

and updates the coefficient of the adaptive filter 4 in the positive direction based on the calculation result.

The symbols such as "$W_j$" used in the above expressions are the same as those described above in Embodiment 1.

With the above-described structure, the control speaker 1 operates in the linear region when the low frequency component of the control speaker 1 is at a small level, thereby sufficiently controlling noise which contains a low frequency component (e.g., f1), as illustrated by the solid line (b) in FIG. 4. On the other hand, when the level of the low frequency component of the adaptive filter 4 increases and the input to the control speaker 1 exceeds the threshold level Ls to enter the non-linear region, the update operation of the coefficient of the adaptive filter 4 is restricted so as to reduce the low frequency gain. As a result, it is possible to stably control noise without generating a distortion, as illustrated by the solid line (b) in FIG. 10.

Thus, with the noise control system of the present embodiment, it is possible to effectively utilize the linear operability of the control speaker 1 while suppressing the operation thereof in the non-linear region, so as to provide an optimal noise control for low frequency level noise.

In the example illustrated in FIG. 21, one of the output of the digital filter 8 and the output of the error detector 2 is always selected by the selector 122, while one of the output of the digital filter 5 and the output of the digital filter 7 is always selected by the selector 121. Alternatively, each of the selectors 121 and 122 may perform a thinning-out operation on the outputs at an appropriate thinning-out frequency.

For example, when the low frequency component of the output from the digital filter 8 exceeds Ls, the selector 122 may operate to transfer the output of the error detector 2 to the coefficient update calculator 6 only at one timing out of 16 transfer timings, while transferring nothing to the coefficient update calculator 6 at the other transfer timings (thus, the outputs of the error detector 2 to be transferred are thinned out), and to transfer the output of the digital filter 8 to the coefficient update calculator 6 only at one timing out of 4 transfer timings, while transferring nothing to the coefficient update calculator 6 at the other transfer timings (thus, the outputs of the digital filter 8 to be transferred are thinned out). Simultaneously, the selector 121 also operates in a manner similar to that of the selector 122 regarding the selection of the outputs from the digital filters 5 and 7. In this way, the coefficient of the adaptive filter 4 is updated in the negative direction. The above-described operations of the selectors 121 and 122 and the frequency of such operations (i.e., the thinning-out frequency at which the outputs are thinned out) may be controlled by the selection control calculator 123.

In the above description of the preferred embodiments of the invention, the digital filter is set in the low frequency region (e.g., the frequency region where the frequency is less than or equal to the lower limit reproducible frequency $f_L$ of the control speaker 1) in order to suppress the non-linear distortion of the control speaker 1 in the low frequency region. However, it is understood that the frequency band setting of the present invention is not limited thereto, and the coefficient update operation of the adaptive filter 4 having any frequency band can be suppressed by a method similar to that described above.

For example, where external noise, which cannot be detected by the noise detection microphone 3, is introduced into the error detection microphone 2, the correlation between the noise detection signal and the error detection signal is reduced at the frequency of the external noise. In such a case, the noise (external noise) may not be eliminated appropriately, and the adaptive filter 4 may even malfunction to produce abnormal oscillation at the frequency of the eternal noise. In order to prevent this, the passband of the digital filter may be set to coincide with the frequency of the external noise.

As described above, with the noise control system of the present invention, the noise detection signal and the adaptive filter output signal are processed by the band limiting digital filters, which have the same characteristic, so as to produce a coefficient update signal in the negative direction from both of the output signals, thereby controlling the adaptive filter used in a noise control calculation. In this way, the present invention prevents an undesired increase in the coefficient gain of the adaptive filter in the band of the above-described digital filter, while realizing a coefficient control of the adaptive filter used in a noise control calculation without having to use additional hardware such as an adaptive filter or an additional calculation process, thereby realizing a stable noise processing operation.

Moreover, whether or not to perform the negative coefficient update for the adaptive filter is controlled in view of the non-linear characteristics of the noise propagation system or the control sound generator. Thus, it is possible to realize a noise control with no band limitation when the noise signal is small, while stably controlling noise by preventing an increase in the input to the control sound generator when the noise signal is large.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A noise control system, comprising:

a control sound generator for generating a control sound;

an error detector for detecting an error signal between the control sound and noise;

a noise detector for detecting a noise source signal;

an adaptive filter for outputting a control signal;

a coefficient updator for updating a coefficient of the adaptive filter, the coefficient updator comprising at least a first digital filter, a first coefficient update calculator, a second digital filter, a phase inverter, a third digital filter, and a second coefficient update calculator;

the first digital filter approximates a propagation characteristic between the control sound generator and the error detector;

the second and third digital filters have a common passband frequency characteristic, the second coefficient update calculator receives, as inputs thereto, processed outputs from the second and third digital filers;

wherein the coefficient updator has a function of suppressing an increase in a coefficient gain of the adaptive filter in a predetermined frequency band.

2. A noise control system according to claim 1, wherein the coefficient updator is such that:

the first digital filter receives, as an input thereto, an output of the noise detector;

the first coefficient update calculator receives, as inputs thereto, an output of the first digital filter and an output of the error detector;

the phase inverter inverts the output of the noise detector;

the second digital filter receives, as an input thereto, an output of the phase inverter;

the third digital filter receives, as an input thereto, the output of the error detector;

the first coefficient update calculator performs a calculation such that the output of the error detector is reduced, and updates the coefficient of the adaptive filter based on the calculation result; and the second coefficient update calculator performs a calculation such that the output of the third digital filter is reduced, and updates the coefficient of the adaptive filter based on the output of the coefficient update calculator.

3. A noise control system according to claim 1, wherein the coefficient updator is such that:

the first digital filter receives, as an input thereto, an output of the noise detector;

the first coefficient update calculator receives, as inputs thereto, an output of the first digital filter and an output of the error detector;

the second digital filter receives, as an input thereto, an output of the noise detector;

the third digital filter receives, as an input thereto, the output of the error detector;

the phase inverter inverts an output of the second coefficient update calculator;

the first coefficient update calculator performs a calculation such that the output of the error detector is reduced, and updates the coefficient of the adaptive filter based on the calculation result; and the second coefficient update calculator performs a calculation such that the output of the third digital filter is reduced, inverts and outputs the calculation result, and updates the coefficient of the adaptive filter based on the output of the second coefficient update calculator.

4. A noise control system according to claim 1 wherein:

the coefficient updator further comprises: a first selection controller for thinning out the outputs of the first coefficient update calculator; a second selection controller for thinning out the outputs of the second coefficient updator calculator; and a selection control calculator for receiving an output signal of the third digital filter to control the first and second selection controllers;

the first digital filter receives, as an input thereto, an output of the noise detector;

the first coefficient update calculator receives, as inputs thereto, an output of the first digital filter and an output of the error detector;

the phase inverter inverts an output of the adaptive filter;

the third digital filter receives, as an input thereto, an output of the phase inverter;

the first coefficient update calculator performs a calculation such that the output of the error detector is reduced;

the second coefficient update calculator performs a calculation such that the output of the third digital filter is reduced; and when a level of the output signal of the third digital filter exceeds a predetermined value, the selection control calculator updates the coefficient of the adaptive filter by controlling the first and second selection controllers so that the first selection controller performs the thinning-out operation at a thinning-out frequency lower than that of the second selection controller.

5. A noise control system according to claim 1, wherein:

the coefficient updator further comprises: a first selection controller for switching between selecting an output of the first coefficient update calculator and selecting nothing; a second selection controller for switching between selecting an output of the second coefficient update calculator and selecting nothing; and a selection control calculator for receiving an output signal of the third digital filter to control the first and second selection controllers;

the first digital filter receives, as an input thereto, an output of the noise detector;

the first coefficient update calculator receives, as inputs thereto, an output of the first digital filter and an output of the error detector;

the phase inverter inverts an output of the adaptive filter;

the third digital filter receives, as an input thereto, an output of the phase inverter;

the first coefficient update calculator performs a calculation such that the output of the error detector is reduced;

the second coefficient update calculator performs a calculation such that the output of the third digital filter is reduced; and when a level of the output signal of the third digital filter exceeds a predetermined value, the selection control calculator updates the coefficient of the adaptive filter by controlling the first and second selection controllers so that the first selection controller is switched to select nothing at a switching operation frequency lower than that at which the second selection controller is switched to select nothing.

6. A noise control system according to claim 1, wherein:

the coefficient updator further comprises: a signal level converter for receiving an output signal of the third digital filter to convert a level of the signal; and a multiplier for multiplying an output of the signal level converter by an output of the second coefficient update calculator so as to update the coefficient of the adaptive filter;

the first digital filter receives, as an input thereto, an output of the noise detector;

the first coefficient update calculator receives, as inputs thereto, an output of the first digital filter and an output of the error detector;

the second digital filter receives, as an input thereto, the output of the noise detector;

the phase inverter inverts an output of the adaptive filter;

the third digital filter receives, as an input thereto, an output of the phase inverter;

the first coefficient update calculator performs a calculation such that the output of the error detector is reduced;

the second coefficient update calculator performs a calculation such that the output of the third digital filter is reduced; and the signal level converter has an input-output characteristic which is approximated to a characteristic obtained by normalizing an input-distortion characteristic of the control sound generator.

7. A noise control system according to claim 1, wherein the predetermined frequency band exists in a low frequency region.

8. A noise control system according to claim 7, wherein the predetermined frequency band is a frequency region where the frequency is less than or equal to a lower limit reproducible frequency of the control sound generator.

9. A noise control system, comprising:

a control sound generator for generating a control sound;

an error detector for detecting an error signal between the control sound and noise;

a noise detector for detecting a noise source signal;

an adaptive filter for outputting a control signal;

a coefficient updator for updating a coefficient of the adaptive filter, the coefficient updator comprising at least a first digital filter, a second digital filter, a third digital filter, a coefficient update calculator, a phase inverter, a first adder, and a second adder;

the first digital filter approximates a propagation characteristic between the control sound generator and the error detector; and the second and third digital filers have a common pass-band frequency characteristic, wherein the coefficient updator has a function of suppressing an increase in a coefficient gain of the adaptive filter in a predetermined frequency band.

10. A noise control system according to claim 9, wherein the coefficient updator is such that:

the first digital filter receives, as an input thereto, an output of the noise detector;

the second digital filter receives, as an input thereto, the output of the noise detector;

the first adder receives, as inputs thereto, an output of the first digital filter and an output of the second digital filter;

the second adder receives, as inputs thereto, an output of the error detector and an output of the third digital filter;

the coefficient update calculator receives, as inputs thereto, an output of the first adder and an output of the second adder;

the phase inverter inverts an output of the adaptive filter;

the third digital filter receives, as an input thereto, the output of the phase inverter; and the coefficient update calculator performs a calculation such that the output of the second adder is reduced, and updates the coefficient of the adaptive filter based on the calculation result.

11. A noise control system according to claim 9, wherein the coefficient updator is such that:

the first digital filter receives, as an input thereto, an output of the noise detector;

the phase inverter inverts the output of the noise detector;

the second digital filter receives, as an input thereto, the output of the phase inverter;

the first adder receives, as inputs thereto, an output of the first digital filter and an output of the second digital filter;

the second adder receives, as inputs thereto, an output of the error detector and an output of the third digital filter;

the coefficient update calculator receives, as inputs thereto, an output of the first adder and an output of the second adder;

the third digital filter receives, as an input thereto, an output of the adaptive filter; and the coefficient update calculator performs a calculation such that the output of the second adder is reduced, and updates the coefficient of the adaptive filter based on the calculation result.

12. A noise control system according to claim 9, wherein:

the coefficient updator further comprises: a first coefficient controller for multiplying an output of the second digital filter by a first coefficient factor; and a second coefficient controller multiplying an output of the third digital filter by a second coefficient factor;

the first digital filter receives, as an input thereto, an output of the noise detector;

the second digital filter receives, as an input thereto, the output of the noise detector;

the first adder receives, as inputs thereto, an output of the first digital filter and an output of the first coefficient controller;

the second adder receives, as inputs thereto, an output of the error detector and an output of the second coefficient controller;

the coefficient update calculator receives, as inputs thereto, an output of the first adder and an output of the second adder;

the phase inverter inverts an output of the adaptive filter;

the third digital filter receives, as an input thereto, the output of the phase inverter;

each of the first coefficient factor and the second coefficient factor is set to be equal to or more than 1; and the coefficient update calculator performs a calculation such that the output of the second adder is reduced, and updates the coefficient of the adaptive filter based on the calculation results.

13. A noise control system according to claim 12, wherein the first coefficient controller is set so that in a passband of the second digital filter, the output of the first coefficient controller is larger than an output signal of the first digital filter.

14. A noise control system according to claim 12, wherein the second coefficient controller is set so that in a passband of the third digital filter, the output of the second coefficient controller is larger than an output signal of the error detector.

15. A noise control system according to claim 9, wherein:

the coefficient updator further comprises: a first coefficient controller for multiplying an output of the first digital filter by a first coefficient factor; and a second coefficient controller for multiplying an output of the error detector by a second coefficient factor;

the first digital filter receives, as an input thereto, an output of the noise detector;

the second digital filter receives, as an input thereto, the output of the noise detector;

the first adder receives, as inputs thereto, an output of the first coefficient controller and an output of the second digital filter;

the second adder receives, as inputs thereto, an output of the second coefficient controller and an output of the third digital filter;

the coefficient update calculator receives, as inputs thereto, an output of the first adder and an output of the second adder;

the phase inverter inverts an output of the adaptive filter;

the third digital filter receives, as an input thereto, the output of the phase inverter;

each of the first coefficient factor and the second coefficient factor is set to be less than an equal to 1; and the coefficient update calculator performs a calculation such that the output of the second adder is reduced, and updates the coefficient of the adaptive filter based on the calculation result.

16. A noise control system according to claim 15, wherein the first coefficient controller is set so that in a passband of the second digital filter, the output of the first coefficient controller is smaller than an output signal of the first digital filter.

17. A noise control system according to claim 15, wherein the second coefficient controller is set so that in a passband of the third digital filter, the output of the second coefficient controller is smaller than an output signal of the error detector.

18. A noise control system according to claim 9, wherein the predetermined frequency band exists in a low frequency region.

19. A noise control system according to claim 18, wherein the predetermined frequency band is a frequency region where the frequency is less than or equal to a lower limit reproducible frequency of the control sound generator.

20. A noise control system according to claim 9, wherein the predetermined frequency band exists in a frequency region where there is a correlation between an output signal of the noise detector and an output signal of the error detector.

* * * * *